(12) United States Patent
Schuele et al.

(10) Patent No.: US 9,825,202 B2
(45) Date of Patent: Nov. 21, 2017

(54) DISPLAY WITH SURFACE MOUNT EMISSIVE ELEMENTS

(71) Applicant: eLux Inc., Camas, WA (US)

(72) Inventors: Paul J. Schuele, Washougal, WA (US);
Kenji Sasaki, West Linn, WA (US);
Kurt Ulmer, Vancouver, WA (US);
Jong-Jan Lee, Camas, WA (US)

(73) Assignee: eLux, Inc., Camas, WA (US)

( * ) Notice: Subject to any disclaimer, the term of this patent is extended or adjusted under 35 U.S.C. 154(b) by 0 days.

(21) Appl. No.: 15/410,001

(22) Filed: Jan. 19, 2017

(65) Prior Publication Data

US 2017/0133550 A1    May 11, 2017

Related U.S. Application Data

(63) Continuation-in-part of application No. 14/749,569, filed on Jun. 24, 2015, now Pat. No. 9,722,145, and
(Continued)

(51) Int. Cl.
*H01L 33/00* (2010.01)
*H01L 33/06* (2010.01)
(Continued)

(52) U.S. Cl.
CPC ...... *H01L 33/0079* (2013.01); *H01L 25/0753* (2013.01); *H01L 25/167* (2013.01); *H01L 33/06* (2013.01); *H01L 33/20* (2013.01); *H01L 33/30* (2013.01); *H01L 33/38* (2013.01); *H01L 33/44* (2013.01); *H01L 27/1214* (2013.01); *H01L 33/32* (2013.01)

(58) Field of Classification Search
None
See application file for complete search history.

(56) References Cited

U.S. PATENT DOCUMENTS

| 5,545,291 A | 8/1996 | Smith et al. |
| 5,594,463 A | 1/1997 | Sakamoto |

(Continued)

OTHER PUBLICATIONS

US 8,093,720, 01/2012, Tomoda et al. (withdrawn)
U.S. Appl. No. 14/305,295, pending, LED Display Driving Circuits.

*Primary Examiner* — Whitney T Moore
(74) *Attorney, Agent, or Firm* — Law Office of Gerald Maliszewski; Gerald Maliszewski

(57) ABSTRACT

A surface mount emissive element is provided with a top surface and a bottom surface. A first electrical contact is formed exclusively on the top surface, and a second electrical contact is formed exclusively on the top surface. A post extends from the bottom surface. An emissive display is also provided made from surface mount emissive elements and an emissions substrate. The emissions substrate has a top surface with a first plurality of wells formed in the emissions substrate top surface. Each well has a bottom surface, sidewalls, a first electrical interface formed on the bottom surface, and a second electrical interface formed on the bottom surface. The emissions substrate also includes a matrix of column and row conductive traces forming a first plurality of column/row intersections, where each column/row intersection is associated with a corresponding well. A first plurality of emissive elements populates the wells.

32 Claims, 21 Drawing Sheets

Related U.S. Application Data a continuation-in-part of application No. 15/221,571, filed on Jul. 27, 2016, now Pat. No. 9,755,110, and a continuation-in-part of application No. 15/197,266, filed on Jun. 29, 2016, and a continuation-in-part of application No. 15/190,813, filed on Jun. 23, 2016, and a continuation-in-part of application No. 15/158,556, filed on May 18, 2016, and a continuation-in-part of application No. 15/266,796, filed on Sep. 15, 2016, and a continuation-in-part of application No. 14/680,618, filed on Apr. 7, 2015, which is a continuation-in-part of application No. 14/530,230, filed on Oct. 31, 2014.

(51) Int. Cl.
  *H01L 33/20* (2010.01)
  *H01L 33/30* (2010.01)
  *H01L 33/38* (2010.01)
  *H01L 33/44* (2010.01)
  *H01L 25/075* (2006.01)
  *H01L 25/16* (2006.01)
  *H01L 33/32* (2010.01)
  *H01L 27/12* (2006.01)

(56) References Cited

U.S. PATENT DOCUMENTS

| | | | |
|---|---|---|---|
| 5,824,186 | A | 10/1998 | Smith et al. |
| 5,904,545 | A | 5/1999 | Smith et al. |
| 6,274,508 | B1 | 8/2001 | Jacobsen et al. |
| 6,281,038 | B1 | 8/2001 | Jacobsen et al. |
| 6,316,278 | B1 | 11/2001 | Jacobsen et al. |
| 6,417,025 | B1 | 7/2002 | Gengel |
| 6,420,266 | B1 | 7/2002 | Smith et al. |
| 6,468,638 | B2 | 10/2002 | Jacobsen et al. |
| 6,479,395 | B1 | 11/2002 | Smith et al. |
| 6,527,964 | B1 | 3/2003 | Smith et al. |
| 6,555,408 | B1 | 4/2003 | Jacobsen et al. |
| 6,566,744 | B2 | 5/2003 | Gengel |
| 6,586,338 | B2 | 7/2003 | Smith et al. |
| 6,590,346 | B1 | 7/2003 | Hadley et al. |
| 6,606,247 | B2 | 8/2003 | Credelle et al. |
| 6,613,610 | B2 | 9/2003 | Iwafuchi et al. |
| 6,618,030 | B2 | 9/2003 | Kane et al. |
| 6,623,579 | B1 | 9/2003 | Smith et al. |
| 6,657,289 | B1 | 12/2003 | Craig et al. |
| 6,665,044 | B1 | 12/2003 | Jacobsen et al. |
| 6,683,663 | B1 | 1/2004 | Hadley et al. |
| 6,687,987 | B2 | 2/2004 | Mayer et al. |
| 6,723,576 | B2 | 4/2004 | Nozawa et al. |
| 6,731,353 | B1 | 5/2004 | Credelle et al. |
| 6,780,696 | B1 | 8/2004 | Schatz |
| 6,816,380 | B2 | 11/2004 | Credelle et al. |
| 6,825,499 | B2 | 11/2004 | Nakajima et al. |
| 6,850,312 | B2 | 2/2005 | Jacobsen et al. |
| 6,863,219 | B1 | 3/2005 | Jacobsen et al. |
| 6,870,190 | B2 | 3/2005 | Okuyama et al. |
| 6,919,225 | B2 | 7/2005 | Craig et al. |
| 6,927,085 | B2 | 8/2005 | Hadley et al. |
| 6,980,184 | B1 | 12/2005 | Stewart et al. |
| 6,984,927 | B2 | 1/2006 | Tomoda et al. |
| 6,985,361 | B2 | 1/2006 | Credelle et al. |
| 7,046,328 | B2 | 5/2006 | Jacobsen et al. |
| 7,049,207 | B2 | 5/2006 | Tomoda |
| 7,049,227 | B2 | 5/2006 | Tomoda et al. |
| 7,060,542 | B2 | 6/2006 | Nakajima et al. |
| 7,070,851 | B2 | 7/2006 | Jacobsen et al. |
| 7,080,444 | B1 | 7/2006 | Craig et al. |
| 7,087,934 | B2 | 8/2006 | Oohata et al. |
| 7,101,502 | B2 | 9/2006 | Smith et al. |
| 7,113,250 | B2 | 9/2006 | Jacobsen et al. |
| 7,122,826 | B2 | 10/2006 | Okuyama et al. |
| 7,129,514 | B2 | 10/2006 | Okuyama et al. |
| 7,141,176 | B1 | 11/2006 | Smith et al. |
| 7,172,789 | B2 | 2/2007 | Smith et al. |
| 7,179,210 | B2 | 2/2007 | Soukeras |
| 7,199,527 | B2 | 4/2007 | Holman et al. |
| 7,244,326 | B2 | 7/2007 | Craig et al. |
| 7,250,314 | B2 | 7/2007 | Nakajima et al. |
| 7,250,320 | B2 | 7/2007 | Okuyama et al. |
| 7,260,882 | B2 | 8/2007 | Credelle et al. |
| 7,288,432 | B2 | 10/2007 | Jacobsen et al. |
| 7,317,211 | B2 | 1/2008 | Watanabe et al. |
| 7,317,435 | B2 | 1/2008 | Hsueh |
| 7,321,159 | B2 | 1/2008 | Schatz |
| 7,353,598 | B2 | 4/2008 | Craig et al. |
| 7,417,306 | B1 | 8/2008 | Jacobsen et al. |
| 7,425,467 | B2 | 9/2008 | Jacobsen et al. |
| 7,452,748 | B1 | 11/2008 | Craig et al. |
| 7,500,610 | B1 | 3/2009 | Hadley et al. |
| 7,531,218 | B2 | 5/2009 | Smith et al. |
| 7,542,301 | B1 | 6/2009 | Liong et al. |
| 7,561,221 | B2 | 7/2009 | Jacobsen et al. |
| 7,564,064 | B2 | 7/2009 | Oohata et al. |
| 7,572,649 | B2 | 8/2009 | Kanemitsu et al. |
| 7,573,194 | B2 | 8/2009 | Doi et al. |
| 7,576,656 | B2 | 8/2009 | Craig et al. |
| 7,589,355 | B2 | 9/2009 | Tomoda et al. |
| 7,615,479 | B1 | 11/2009 | Craig et al. |
| 7,619,598 | B2 | 11/2009 | Pulvirenti et al. |
| 7,662,008 | B2 | 2/2010 | Hillis et al. |
| 7,763,901 | B2 | 7/2010 | Tomoda |
| 7,774,929 | B2 | 8/2010 | Jacobs |
| 7,795,049 | B2 | 9/2010 | Watanabe et al. |
| 7,795,629 | B2 | 9/2010 | Watanabe et al. |
| 7,838,410 | B2 | 11/2010 | Hirao et al. |
| 7,880,184 | B2 | 2/2011 | Iwafuchi et al. |
| 7,884,543 | B2 | 2/2011 | Doi |
| 7,888,690 | B2 | 2/2011 | Iwafuchi et al. |
| 7,931,063 | B2 | 4/2011 | Craig et al. |
| 7,968,474 | B2 | 6/2011 | Martin et al. |
| 7,977,130 | B2 | 7/2011 | Hillis et al. |
| 8,101,457 | B2 | 1/2012 | Tomoda et al. |
| 8,222,659 | B2 | 7/2012 | Tomoda |
| 8,232,640 | B2 | 7/2012 | Tomoda et al. |
| 8,252,164 | B2 | 8/2012 | Martin et al. |
| 8,257,538 | B2 | 9/2012 | Doi et al. |
| 8,284,120 | B2 | 10/2012 | Hillis et al. |
| 8,300,007 | B2 | 10/2012 | Hillis et al. |
| 8,312,619 | B2 | 11/2012 | Chow et al. |
| 8,333,860 | B1 | 12/2012 | Bibl et al. |
| 8,349,116 | B1 | 1/2013 | Bibl et al. |
| 8,361,268 | B2 | 1/2013 | Mizuno et al. |
| 8,361,297 | B2 | 1/2013 | Mayer et al. |
| 8,379,003 | B2 | 2/2013 | Kawaguchi et al. |
| 8,382,544 | B2 | 2/2013 | Hillis et al. |
| 8,383,506 | B1 | 2/2013 | Golda et al. |
| 8,384,116 | B2 | 2/2013 | Ohtorii et al. |
| 8,390,537 | B2 | 3/2013 | Hillis et al. |
| 8,409,886 | B2 | 4/2013 | Iwafuchi et al. |
| 8,415,767 | B1 | 4/2013 | Golda et al. |
| 8,415,768 | B1 | 4/2013 | Golda et al. |
| 8,415,771 | B1 | 4/2013 | Golda et al. |
| 8,415,879 | B2 | 4/2013 | Lowenthal et al. |
| 8,426,227 | B1 | 4/2013 | Bibl et al. |
| 8,476,826 | B2 | 7/2013 | Oohata et al. |
| 8,518,204 | B2 | 8/2013 | Hu et al. |
| 8,552,436 | B2 | 10/2013 | Bibl et al. |
| 8,558,243 | B2 | 10/2013 | Bibl et al. |
| 8,569,115 | B1 | 10/2013 | Golda et al. |
| 8,570,482 | B2 | 10/2013 | Hillis et al. |
| 8,573,469 | B2 | 11/2013 | Hu et al. |
| 8,628,994 | B2 | 1/2014 | Tomoda |
| 8,646,505 | B2 | 2/2014 | Bibl et al. |
| 8,648,328 | B2 | 2/2014 | Crowder et al. |
| 8,669,703 | B2 | 3/2014 | Hillis et al. |
| 8,683,416 | B1 | 3/2014 | Trivedi et al. |
| 8,685,774 | B2 | 4/2014 | Crowder et al. |
| 8,686,447 | B2 | 4/2014 | Tomoda et al. |
| 8,686,542 | B2 | 4/2014 | Golda et al. |
| 8,711,063 | B2 | 4/2014 | Hillis et al. |

(56) References Cited

U.S. PATENT DOCUMENTS

| | | | |
|---|---|---|---|
| 8,789,573 | B2 | 7/2014 | Bibl et al. |
| 8,809,126 | B2 | 8/2014 | Lowenthal et al. |
| 8,846,457 | B2 | 9/2014 | Lowenthal et al. |
| 8,906,713 | B2 | 12/2014 | Rettke |
| 9,240,397 | B2 | 1/2016 | Bibl et al. |
| 9,252,375 | B2 | 2/2016 | Bibl et al. |
| 9,269,322 | B2 | 2/2016 | Nathan et al. |
| 9,293,476 | B2 | 3/2016 | Bedell et al. |
| 9,305,807 | B2 | 4/2016 | Whiting et al. |
| 9,318,475 | B2 | 4/2016 | Bibl et al. |
| 9,343,448 | B2 | 5/2016 | Sakariya et al. |
| 9,653,441 | B1 * | 5/2017 | Chen .................... H01L 25/167 |
| 2002/0153606 | A1 | 10/2002 | Gengel |
| 2005/0206585 | A1 | 9/2005 | Stewart et al. |
| 2005/0233504 | A1 | 10/2005 | Doi et al. |
| 2010/0186883 | A1 | 7/2010 | Tomoda |
| 2011/0266039 | A1 | 11/2011 | Tomoda |
| 2011/0273410 | A1 | 11/2011 | Park et al. |
| 2012/0169786 | A1 | 7/2012 | Okuyama et al. |
| 2012/0218318 | A1 | 8/2012 | Hirao et al. |
| 2013/0126098 | A1 | 5/2013 | Bibl et al. |
| 2013/0126827 | A1 | 5/2013 | Bibl et al. |
| 2013/0126921 | A1 * | 5/2013 | Mohammed ........ H01L 33/0079 257/98 |
| 2013/0128585 | A1 | 5/2013 | Bibl et al. |
| 2013/0210194 | A1 | 8/2013 | Bibl et al. |
| 2014/0008691 | A1 | 1/2014 | Tomoda et al. |
| 2014/0048909 | A1 | 2/2014 | Golda et al. |
| 2014/0084482 | A1 | 3/2014 | Hu et al. |
| 2015/0179877 | A1 | 6/2015 | Hu et al. |
| 2015/0263066 | A1 | 9/2015 | Hu et al. |
| 2016/0086534 | A1 | 3/2016 | Seo et al. |

\* cited by examiner

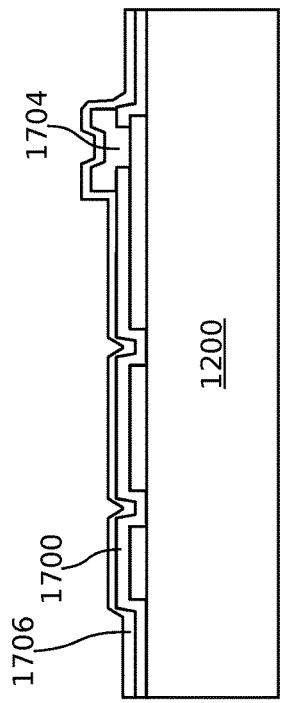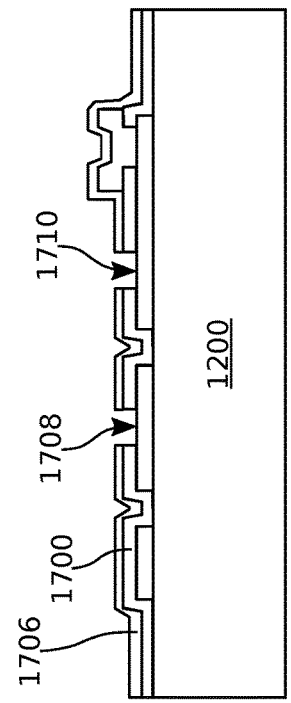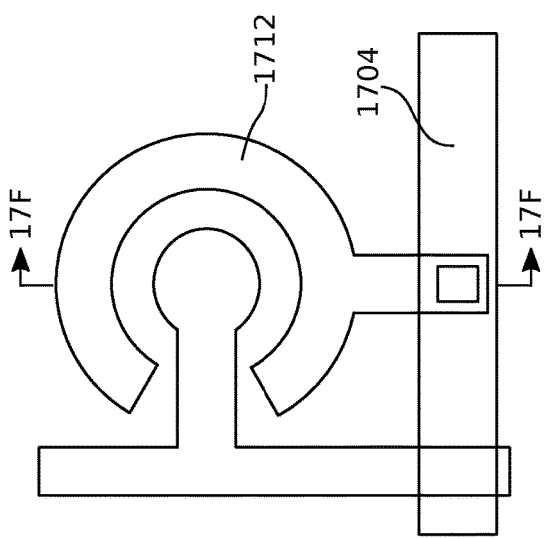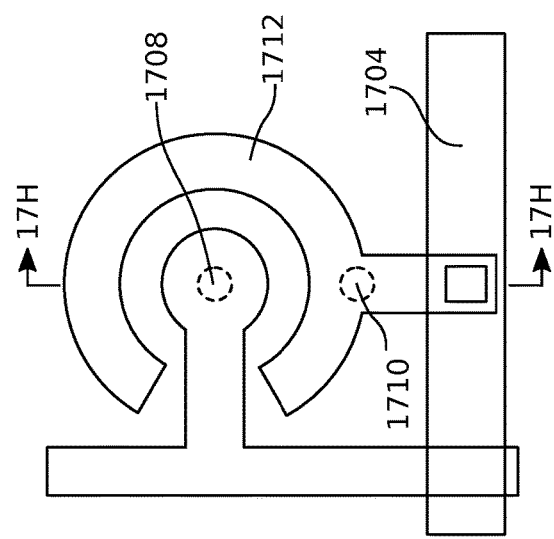

DISPLAY WITH SURFACE MOUNT EMISSIVE ELEMENTS

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to integrated circuits (ICs) and, more particularly, to a surface mount emissive element, and an emissive display made using the surface mount emissive elements.

2. Description of the Related Art

The current competing technologies for large area display are liquid crystal display (LCD), organic light emitting device (OLED) display, and more recently, inorganic LED display. The weaknesses of LCD, which the current disclosure directly addresses, are 1) low efficiency where only about 5% of the light generated by the backlight is seen as an image by the user, and 2) low dynamic range because the LC material cannot completely block light to produce a black pixel. The weaknesses of OLED display are poor reliability and low efficiency (~5% QE) of the blue OLED material. The use of inorganic micro-LEDs (uLEDs) in a display would provide a very high efficiency because the display would not use color filters and polarizers to absorb light. As used herein, a uLED is an LED with a diameter or cross-sectional area of 100 microns or less. The inorganic uLED display would have very high contrast because black pixels are set to emit no light. For an inorganic uLED display, blue gallium nitride (GaN) LEDs would be 35-40% efficient, with a reliability of over 50,000 hours, as has been established in general lighting. Sony has developed a passive matrix of uLEDs arranged in a display array using a pick and place system. However, since large displays require millions of LEDs, displays made by this process are time and cost prohibitive compared to other technologies.

The fluidic transfer of microfabricated electronic devices, optoelectronic devices, and sub-systems from a donor substrate/wafer to a large area and/or unconventional substrate provides a new opportunity to extend the application range of electronic and optoelectronic devices. For example, display pixel size LED micro structures, such as rods, fins or disks, can be first fabricated on small size wafers and then be transferred to large panel glass substrate to make a direct emitting display requiring no backlighting.

Conventional transfer techniques such as inkjet printing or robotic pick-and-place work reasonable well in certain particular applications. However, these conventional techniques are either not cost effective or so poor in yield that they cannot be applied to directly transfer LED micro structures.

There are three major processes in the fabrication of inorganic uLED disks for use in direct emission displays. These processes are: uLED disk fabrication; uLED disk distribution onto a transparent substrate; and, uLED disk interconnection. Since a fluidic assembly process distributes uLED disks randomly inside transparent substrate placement wells, it makes conventional IC style contact hole opening/metal interconnection design extremely challenging. Extra tolerances are required in the (opaque) interconnections to address this random distribution, resulting in a substantial loss in the emission area fill factor. Further, the complexity required to make these connections results in either a poor yield and/or high cost.

FIGS. 1A and 1B are plan views of a top-contact LED disk located in a substrate well (prior art). In FIG. 1A, $D_d$ denotes the diameter of the LED (e.g., GaN) disk, $D_c$ denotes the diameter of the micro-cavity or well into which the uLED disk has been distributed, and $D_p$ denotes the diameter of the p-doped GaN (p-GaN) area, assuming the p-GaN is formed on the top of the disk. Area 100 is the n-GaN contact, where the p-GaN and MQW have been removed by a reactive ion etch (RIE). The inner circular area 102 is the full LED stack with p-GaN on top. A layer of nickel oxide (NiOx)/indium tin oxide (ITO) may be formed on the surface of area 102. In considering typical photolithography misalignment tolerances (up to 2 microns ($\mu$m)), the circular area 102 is off the GaN disk center by 2 $\mu$m. Since only the area 102 can emit light, the emission area fill factor is only about 70.6%. Nearly 30% of emission area is lost due to the n-GaN opening 100.

FIG. 1B shows the working area for anode end connection 104 (Dpc). Connections made outside of the 24 $\mu$m diameter area 104 are likely to result in either a short circuit or open circuit. Conventional metal interconnection to the n-GaN area 100 further reduces the emission area fill factor. Only 31.4% area of the GaN disk will emit light in this example.

FIG. 2 is a partial cross-sectional view of a bottom cathode contact architecture (prior art). This option avoids the significant emission area fill factor loss associated with a conventional top-contact LED disk. A bottom interconnection electrode 200 is first evaporated and patterned on a substrate 202, followed by micro-cavity (well) 204 formation. A thin layer of low melting temperature metal 206 is then coated on the bottom electrode surface inside the micro-cavity 204. The GaN disk 208 (n-GaN 210/p-GaN 212) is then distributed into the micro-cavity 204. After interlayer dielectric film 214 patterning, the top interconnection electrode 216 is evaporated and patterned to complete the whole process flow.

The process flow described by FIG. 2 is relatively simple. The front-side emission area fill factor can possible reach a maximum of 85% with a carefully selected top metal wiring design. Major challenges of this flow include the bottom contact yield, uniformity, reliability and repeatability, and the tradeoff between the bottom contact yield and the bottom electrode area if a backside emission opening is needed.

It would be advantageous if large emissive displays could be efficiently fabricated using a fluidic assembly process, through the employment of surface mount emissive elements.

SUMMARY OF THE INVENTION

Disclosed herein is a direct emission display or liquid crystal display (LCD) backlight using inorganic micro light emitting diodes (LEDs), to enable the fabrication of a large area high dynamic range display with reasonable cost and high reliability. For example, an array of inorganic micro-LEDs (uLEDs) in a surface mount configuration can be fabricated by fluidic assembly to make a high dynamic range emissive display. uLED emitters are fabricated by etching small disk shapes in a conventional planar LED structure fabricated on a sapphire substrate. Disks are processed to form separate anode and cathode electrodes on the top surface of the uLED. The resulting uLEDs are released by a laser lift off process and harvested to form a suspension in a suitable liquid such as isopropanol (IPA), acetone, or distilled water. This suspension is deposited on a display substrate that has been prepared with an array of well structures with two electrodes that match the anode and cathode electrodes on a uLED disk. The well is a cylindrical opening slightly larger than the disk diameter so that one uLED can be deposited in the well in a position with the LED electrodes in contact with the electrodes on the substrate. Since both the LED electrodes directly overlie and are adjacent to the well bottom surface, electrical connections are greatly simplified, in contrast to LED disks having one or both electrodes exposed by the well opening, and so requiring addition interconnection layers and processing.

As a result of suitable annealing, the uLEDs are connected to the array electrodes on the substrate so they can be powered by a suitable drive circuit to emit light. The array can be powered as a passive matrix so each row is turned on in sequence with each sub-pixel in the array powered at a controlled current to produce the required brightness. However, due to sampling and power restraints this simple driving scheme is necessarily limited to a relatively small number of rows. Alternatively, each sub-pixel can be controlled by a thin-film transistor (TFT) driving circuit, which can control the amount of drive current based on the charge stored in a capacitor. This active matrix (AM) circuit configuration allows the uLED to be powered nearly 100% of the time so there is no limit on the number of rows in a display, except for the power supplied to each column.

The surface mount uLED architecture offers several major advantages compared with the current vertical uLED display, where the vertical uLEDs have top and bottom surface electrical contacts:

1) The small emitter area is better suited to high resolution active matrix (AM) display but the overall disk size is large enough for fluidic assembly.

2) The process of fluidic assembly occurs as the last major operation so smaller glass can be used without returning to an LCD fab for metallization after assembly.

3) Interconnect patterning occurs before wells are formed, so no metal defects exist from misaligned uLEDs and there is no need for deep interconnect from the substrate through the well layer.

4) After annealing, the uLED is electrically connected but exposed so there is the possibility of electrical testing to see if a given uLED lights up, followed by pick-place repair of defective uLEDs.

These advantages tend to offset the emission area of the surface mount LEDs being a relatively small proportion of the area of the LED growth substrate, increasing the cost per pixel. Further, the uLED fabrication process is relatively complex with multiple patterning steps including post fabrication which occurs after laser lift off (LLO).

Accordingly, a surface mount emissive element is provided with a top surface and a bottom surface. A first electrical contact is formed exclusively on the top surface, and a second electrical contact is formed exclusively on the top surface. A post extends from the bottom surface. In one aspect, the surface mount emissive element is a surface mount light emitting diode (SMLED), made from a first semiconductor layer, with either an n-dopant or a p-dopant, and a second semiconductor layer, made with the opposite dopant used for the first semiconductor layer. A multiple quantum well (MQW) layer is interposed between the first semiconductor layer and the second semiconductor layer. Typically, the first semiconductor layer and second semiconductor layer are gallium nitride (GaN) or aluminum gallium indium phosphide (AlGaInP).

An emissive display is also provided made from surface mount emissive elements, as described above, and an emissions substrate. The emissions substrate has a top surface with a first plurality of wells formed in the emissions substrate top surface. Each well has a bottom surface, sidewalls, a first electrical interface formed on the bottom surface, and a second electrical interface formed on the bottom surface. The emissions substrate also includes a matrix of column and row conductive traces forming a first plurality of column/row intersections, where each column/row intersection is associated with a corresponding well. A first plurality of emissive elements populates the wells. In one aspect, a color modifier overlies each emissive element bottom surface (e.g., to produce a monochrome color such as white), and the display includes a liquid crystal display (LCD) substrate overlying the emissions substrate top surface.

The emissive display may also be a direct emissions type of display, in which case a plurality of first color modifiers overlies the bottom surfaces of corresponding SMLEDs. A plurality of second color modifiers overlies the bottom surfaces of corresponding SMLEDs, where the second color is different than the first color. If the display is red-green-blue (RGB) and only one type of LED is used (e.g., a blue color GaN LED), then a plurality of light diffusers would overlie the bottom surfaces of corresponding SMLEDs with no overlying color modifier. The result is a display with pixel regions, each pixel region including a SMLED with an overlying first color modifier (e.g., green), a SMLED with an overlying second color modifier (e.g., red), and a SMLED with no overlying color modifier (e.g., blue). Alternatively, if both blue and green emitting GaNs LEDs are used, then color modifiers are only need to create the red color.

In one aspect, the first electrical contact (electrode) of each SMLED is configured as a ring with a first diameter, and the first semiconductor layer and MQW layer of each SMLED are a stack overlying the first electrical contact, in the shape of a ring. Then, the second electrical contact of each SMLED is formed within a first electrical contact ring perimeter, and the second semiconductor layer of each SMLED has a disk shape with a center portion overlying the second electrical contact. Each well first electrical interface is configured as a partial ring with the first diameter, and having a mouth opening, and each well second electrical interface is configured as a trace extending into the mouth of a corresponding first electrical interface partial ring. Alternatively, the first semiconductor layer and MQW layer of each SMLED may be a stack overlying the second electrical contact, and the second semiconductor layer overlies the first electrical contact.

As another alternative, each emissive element top surface may be bi-planar with a first level and a second level, so that each emissive element first electrical contact is formed on the first level of the top surface and each emissive element second electrical contact is formed in the second level of the top surface. Each well bottom surface is likewise bi-planar with a first level and a second level, with each well first electrical interface formed on the well bottom first level and each well second electrical interface formed on the well bottom second level.

The emissive elements may be enabling using active matrix (AM) drive circuits, with each drive circuit connected to a corresponding column/row intersection, and connected to the first electrical interface of a corresponding well. Then, the emissions substrate would also include a network of reference voltage (e.g., ground) traces connected to the second electrical interface of each well. Alternatively, the matrix of column and row traces form a passive matrix (PM) with the column trace of each column/row intersection connected to the first electrical interface of a corresponding well, and the row trace of each column/row intersection connected to the second electrical interface of each well.

Additional details of the above-described surface mount emissive element and emissive display are provided below.

BRIEF DESCRIPTION OF THE DRAWINGS

FIGS. 17A through 17L depict plan and partial cross-sectional views of an exemplary emissions substrate fabrication process.

DETAILED DESCRIPTION

Figure 1A:
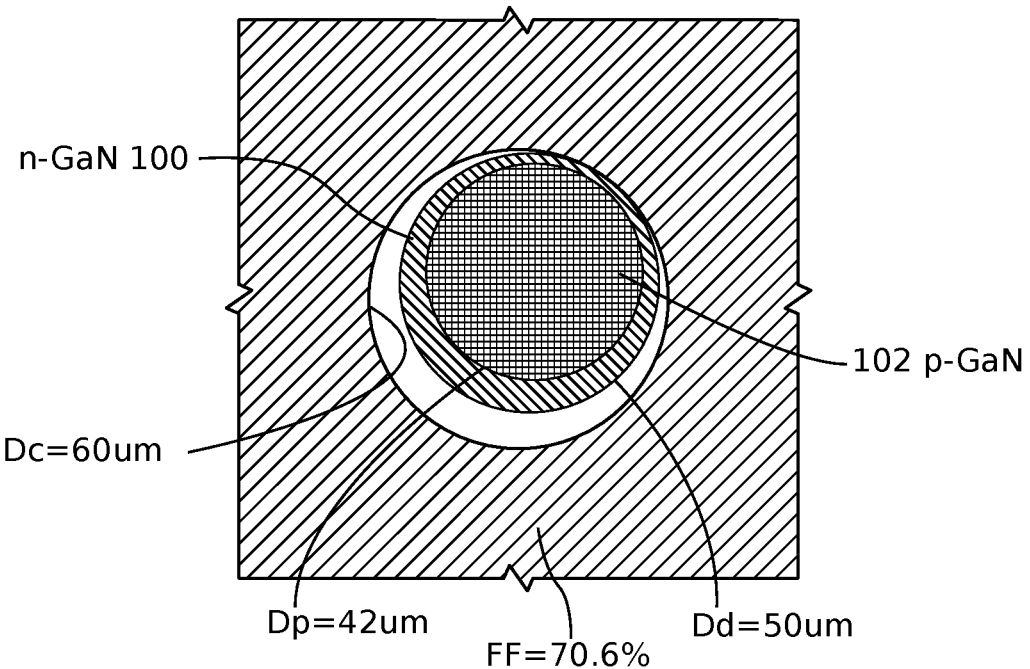
FIGS. 1A and 1B are plan views of a top-contact LED disk located in a substrate well (prior art).
Figure 1B:
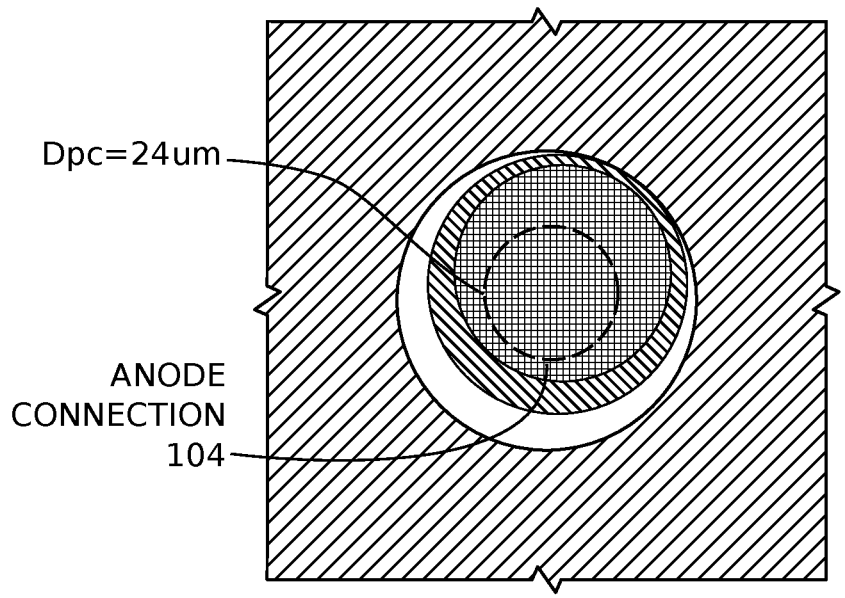
Figure 2:
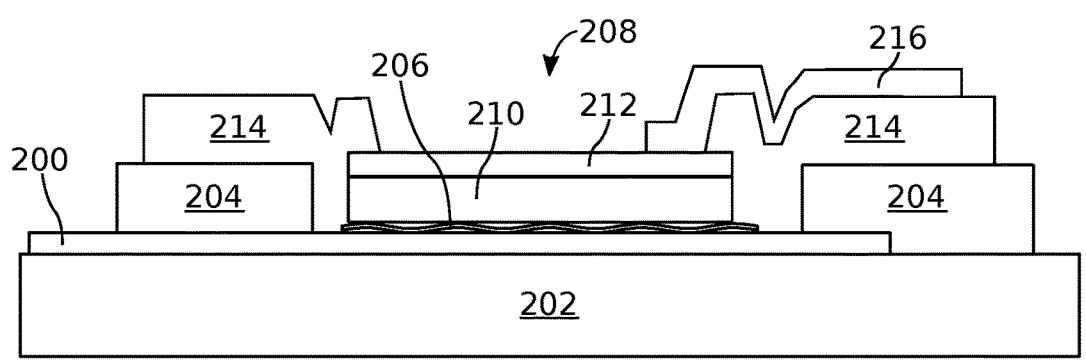
FIG. 2 is a partial cross-sectional view of a bottom cathode contact architecture (prior art).
Figure 3:
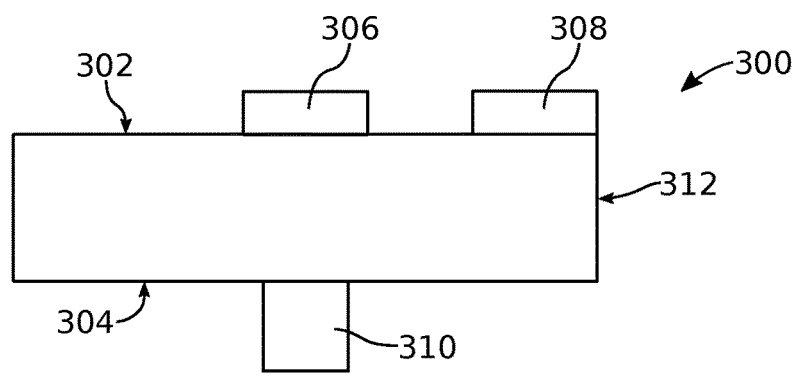
FIG. 3 is a partial cross-sectional view of a surface mount emissive element.

FIG. 3 is a partial cross-sectional view of a surface mount emissive element. The surface mount emissive element 300 comprises a top surface 302, a bottom surface 304, a first electrical contact 306 formed exclusively on the top surface, and a second electrical contact 308 formed exclusively on the top surface. By "exclusively on the top surface" it is meant that the electrical contacts or electrodes do not extend over the emissive element sides 312 or bottom surface 304. The electrical contacts may be a metal, doped semiconductor, or transparent conductive oxide (TCO) such as indium tin oxide (ITO). Although not explicitly shown as a distinct layer, the electrical contacts 306 and 308 may be solder or solder-coated (e.g., a eutectic solder) for subsequent connection to an emissive substrate. The emissive element 300 further comprises a post 310 extending from the bottom surface 304. In one aspect, the post 310 is centered in the middle of the bottom surface 304. One example of a emissive element is a light emitting diode (LED). Although not light emissive, other two-terminal surface mount elements include photodiodes, thermistors, pressure sensors, and piezoelectric devices.

Figure 4A:
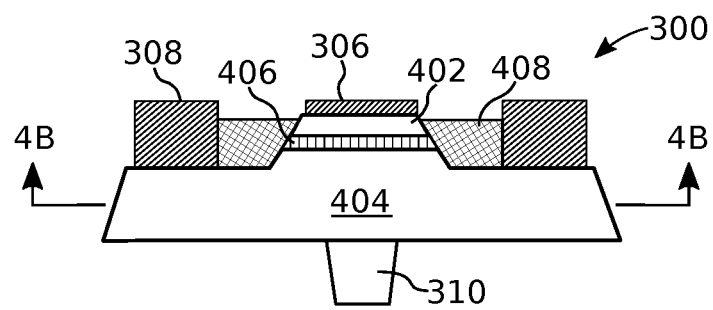
FIGS. 4A and 4B are, respectively, partial cross-sectional and plan views of a surface mount emissive element enabled as a surface mount light emitting diode (SMLED).
Figure 4B:
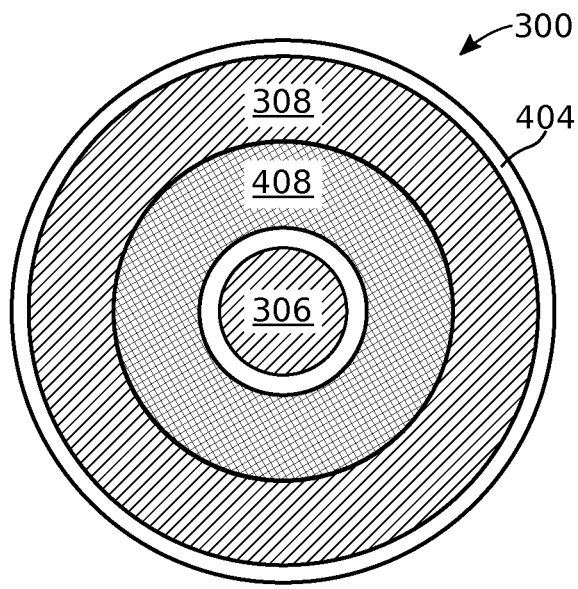

FIGS. 4A and 4B are, respectively, partial cross-sectional and plan views of a surface mount emissive element enabled as a surface mount light emitting diode (SMLED). The SMLED 300 comprises a first semiconductor layer 402, with either an n-dopant or a p-dopant. A second semiconductor layer 404 with the dopant type not used in the first semiconductor layer 402. A multiple quantum well (MQW) layer 406 is interposed between the first semiconductor layer 402 and the second semiconductor layer 404. The MQW layer 406 may typically be a series of quantum well layers (typically 5 layers—e.g., alternating 5 nm of indium gallium nitride (InGaN) with 9 nm of n-doped GaN (n-GaN)) not shown. There may also be an aluminum gallium nitride (AlGaN) electron blocking layer (not shown) between MQW layers and the p-doped semiconductor layer. The outer semiconductor layer may be p-doped GaN (Mg doping) about 200 nm thick. A high-brightness blue LED can be formed, or a green LED if a higher indium content is used in the MQW. The most practical first and second semiconductor layer materials are either gallium nitride (GaN), capable of emitting a blue or green light, and aluminum gallium indium phosphide (AlGaInP), capable of emitting red light.

The second electrical contact 308 is configured as a ring, and the second semiconductor layer 404 has a disk shape with a perimeter underlying the second electrical contact ring. The first electrical contact 306 is formed within a second electrical contact 308 ring perimeter, and the first semiconductor layer 402 and MQW layer 406 are a stack underlying the first electrical contact. A moat may be formed between the second electrical contact 308 ring and the first electrical contact 306, filled with an electrical insulator 408.

Conventional LED processing (e.g., LEDs used for lighting) only occurs on one surface prior to separation from the sapphire substrate. Some of these processes use a laser liftoff (LLO) to separate the LEDs from the sapphire substrate as the final step. Other processes do not use LLO, but rather, cut up the sapphire substrate to singulate the LEDs. However, the SMLED architecture requires electrodes on the surface opposite the post, so that the post is made after the uLED is lifted off the sapphire substrate. Conventional processes do not provide a means of maintaining the known position of each LED as the LEDs are removed from the sapphire so that photolithography can be performed on the bottom of the LED. Precise x-y position is required to accurately locate the posts at the desired location of the LED top surface (e.g., in the center). Precise z (vertical) position is required to establish a focal plane to image the post structure with the dimensional control required for fluidic assembly (e.g., surface orientation). That is, SMLED LLO requires that the SMLEDs must be located on a transfer substrate in a controlled manner to form their post, and then released from the transfer substrate to make the suspension for fluidic assembly.

Figure 5:
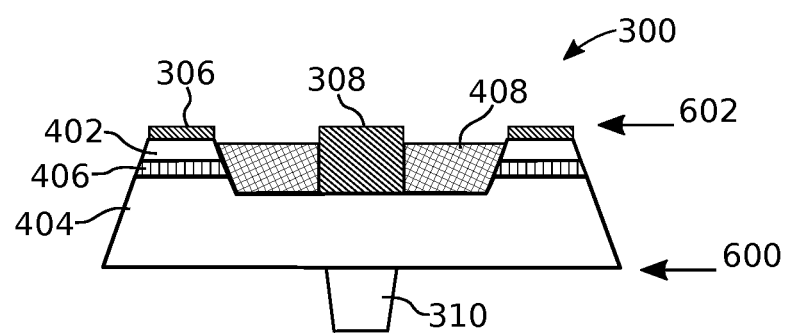
FIG. 5 is a partial cross-sectional view depicting an alternative to the LED of FIG. 4A.

FIG. 5 is a partial cross-sectional view depicting an alternative to the LED of FIG. 4A. In this aspect, the first electrical contact (electrode) 306 is configured as a ring, and the first semiconductor layer 402 and MQW layer 406 are a stack underlying the first electrical contact, in the shape of a ring. The second electrical contact 308 is formed within a first electrical contact 306 ring perimeter. The second semiconductor layer 404 has a disk shape with a center portion underlying the second electrical contact. As shown, a moat is formed between the first electrical contact 306 ring and the second electrical contact 308. An electrical insulator 408 fills the moat.

Figure 6:
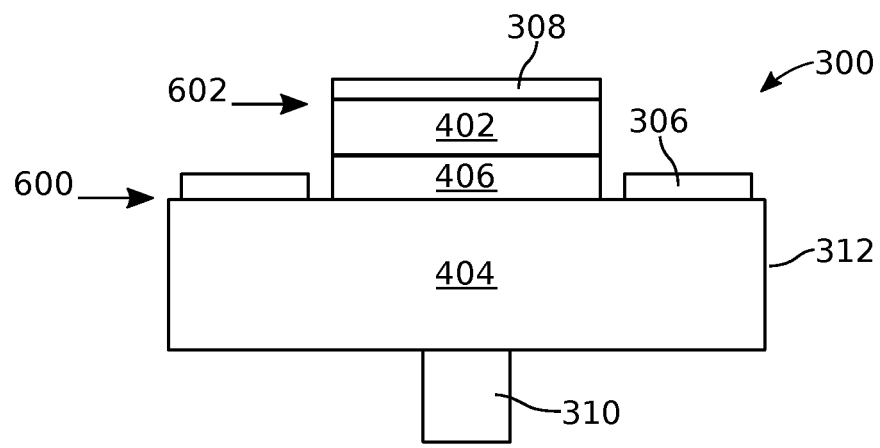
FIG. 6 is a partial cross-sectional view depicting a bi-level variation of the emissive element.

FIG. 6 is a partial cross-sectional view depicting a bi-level variation of the emissive element. In FIGS. 4A and 5 it can be seen that the top surface is planar and the bottom surface is planar. As used herein, "planar" refers to a surface that is globally flat with a root mean square (RMS) roughness of less than 10 nanometers (nm). Alternatively, as shown in FIG. 6, the surface mount emissive element top surface is bi-planar with a first level 600 and a second level 602. The first electrical contact 306 is formed on the first level 600 of the top surface, and the second electrical contact 308 is formed on the second level 602 of the top surface. Alternatively but not shown, the second electrical contact may be formed on the first level of the top surface, and the first electrical contact may be formed on the second level of the top surface.

Figure 7A:
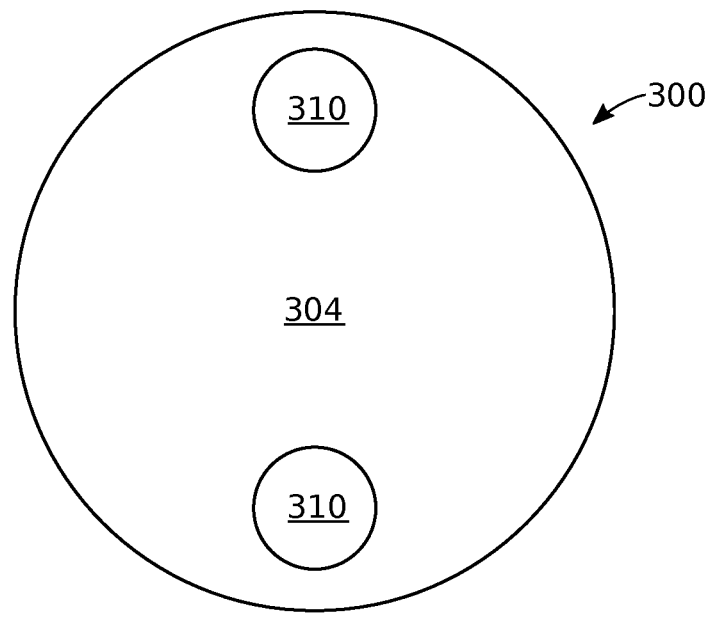
FIGS. 7A and 7B are bottom surface views depicting surface mount emissive element post variations.
Figure 7B:
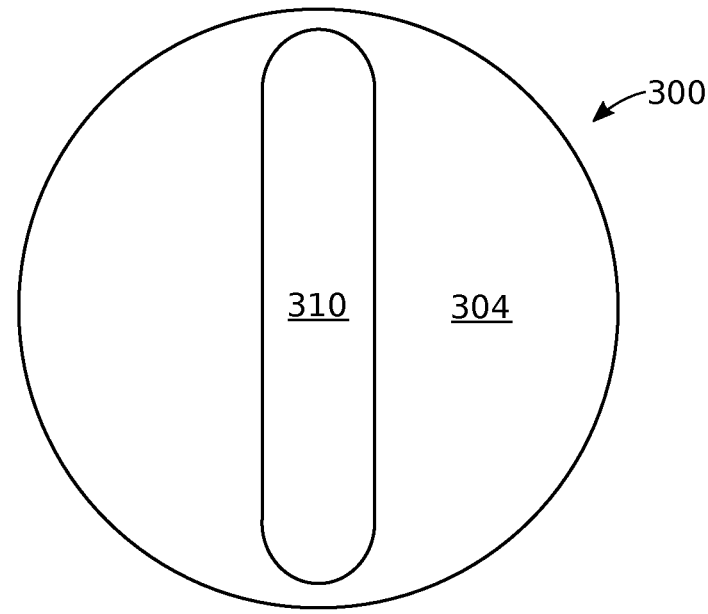

FIGS. 7A and 7B are bottom surface views depicting surface mount emissive element post variations. In one aspect, the surface mount emissive element may comprise a plurality of posts 310 extending from the bottom surface 304, as shown in FIG. 7A. Note: the surface mount emissive element 300 is not limited to any particular number of posts, placement of posts, or any particular post shape. Two posts are shown in FIG. 7A, and a post in the shape of a fin is depicted in FIG. 7B. Other shapes or combination of shapes are also feasible. In one aspect, particularly in the case of a single post, the post is centered on the emissive element bottom surface, which acts to tip one edge of the emissive element into the fluidic flow. In FIGS. 7A and 7B, the post(s) act to tip the emissive element in a direction perpendicular to a vertical axis coming out of the page.

Figure 8A:
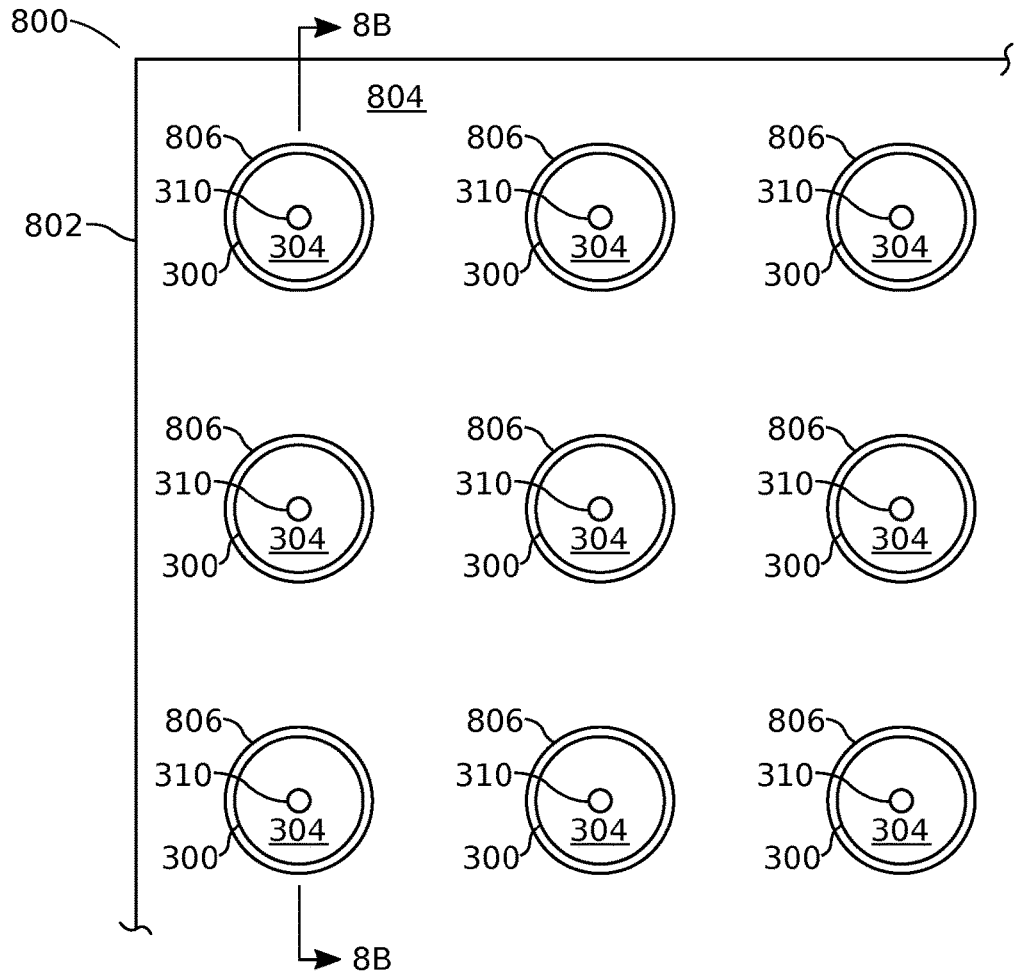
FIGS. 8A and 8B are, respectively, plan and partial cross-sectional views of an emissive display.
Figure 8B:
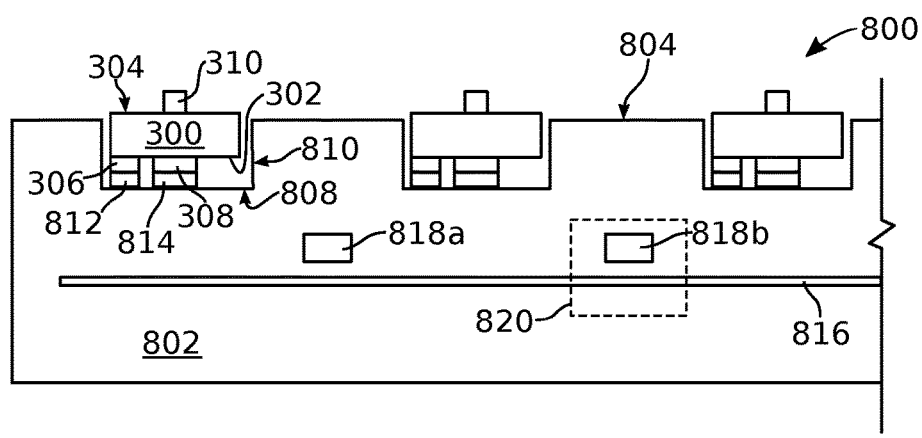

FIGS. 8A and 8B are, respectively, plan and partial cross-sectional views of an emissive display. Some examples of emissive displays include televisions, computer monitors, handheld device screens, and backlights for LCD displays, as might be used for some of the above-mentioned examples, or as a direct emissions display. The emissive display 800 comprises an emissions substrate 802 with a top surface 804. The emissions substrate 802 also comprises a first plurality of wells 806 formed in the emissions substrate top surface 804. Each well 806 comprises a bottom surface 808, sidewalls 810, a first electrical interface 812 formed on the bottom surface, and a second electrical interface 814 formed on the bottom surface. Although not explicitly shown as a distinct layer, the first electrical interface 812 and the second electrical interface 814 may be solder-coated for connection to emissive element electrical contacts. A matrix of column conductive traces 816 and row conductive traces 818 form a first plurality of column/row intersections 820, where each column/row intersection is associated with a corresponding well 806. Additional details of the interface between the wells and the matrix of column and row traces are provided below. A first plurality of emissive elements 300 populates the wells 806. Each emissive element 300 comprises a top surface 302 overlying a corresponding well bottom surface 808. The emissive elements 300 have a bottom surface 304 and a post 310 extending from the bottom surface. A first electrical contact (electrode) 306 is formed on the emissive element top surface 302 and connected to a corresponding well first electrical interface 812. Although not explicitly shown as a distinct layer, the first electrical contact 306 and the second electrical contact 308 may be solder or solder-coated for connection to emissive substrate electrical interfaces. A second electrical contact 308 is formed on the emissive element top surface 302 and connected to a corresponding well second electrical interface 814. Note that the electrical contacts of the emissive device, and the electrical interfaces of wells can be made of a reflective material (e.g., a metal) to direct light towards the top surface 804 of the emissions substrate 802.

Since both the emissive element contacts are formed on the top surface 302, the device may be referred to as a surface mount emissive element. It should also be noted that the bottom surface 304 of the emissive element overlies the top surface 302 when the emissive element has been captured in a well 806. As noted in the explanations above, the emissive element first and second electrical contacts 306/308 are formed exclusively on the emissive element top surface 302. As a result, there is no need for an electrical interface to be formed over the emissions substrate top surface 804 after the wells are populated. As noted above, the emissive elements may be surface mount light emitting diodes (SMLEDs), the details of which are not repeated here in the interest of brevity. In one aspect, each emissive element top surface 302 is planar and each well bottom surface 808 is planar, as defined above. The emissive element bottom surface 304 may also be planar.

The emissive elements have dimensions that permit the emissive elements to fit inside the well cavities. As used herein, the word "fit" refers to the mating of two mechanical components. Manufactured parts are very frequently required to mate with one another. They may be designed to slide freely against one another or they may be designed to bind together to form a single unit or assembly. There are three general categories of fits. A clearance fit may be desirable for an object (e.g., emissive element) to rotate or slide freely within the well, this is usually referred to as a "sliding fit." An interference fits may be desirable for when as object is to be securely held within the well, this is usually referred to as an interference fit. A transition fits may be desirable for when the object is to be held securely, yet not so securely that it cannot be disassembled or rotated in the well, this is usually referred to herein as a location or transition fit. The emissive elements typically have a clearance or sliding fit with respect to the well.

Figure 9A:
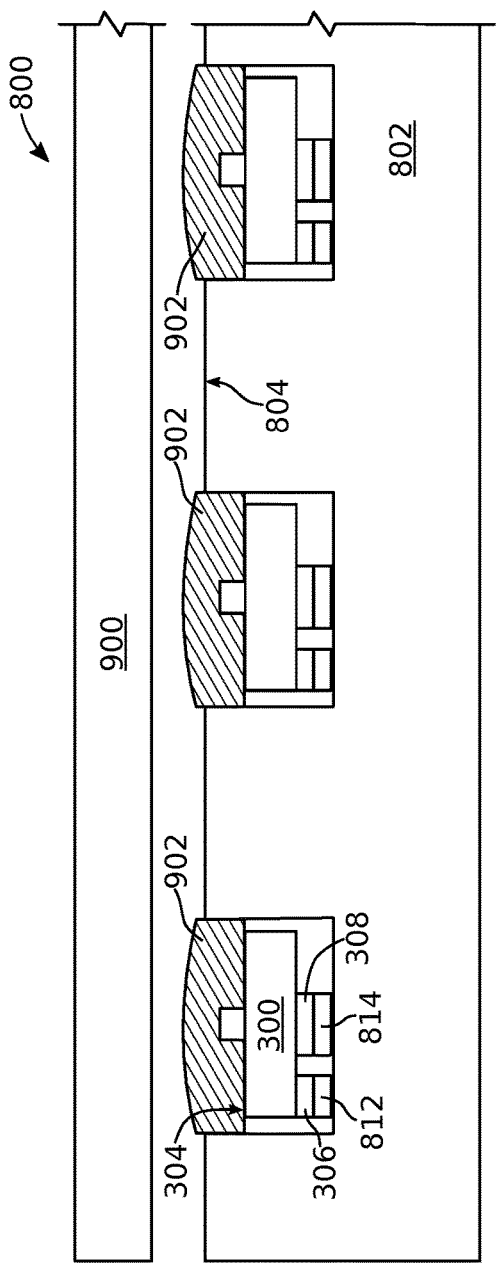
FIGS. 9A and 9B are partial cross-sectional views depicting two different approaches to enable the emissions substrate of FIGS. 8A and 8B as a backlight.
Figure 9B:
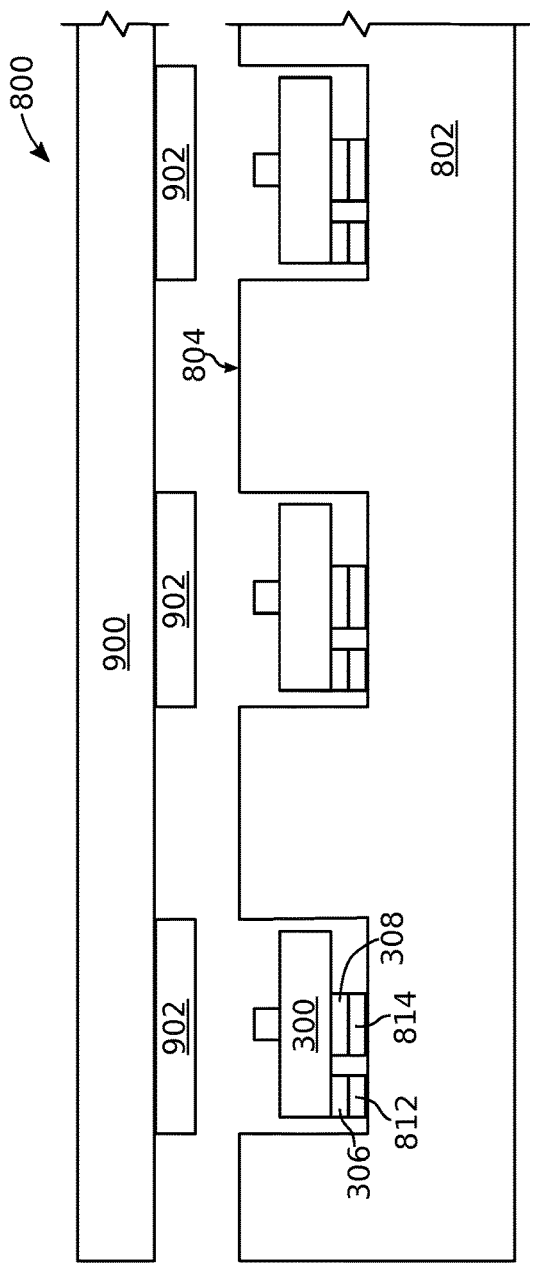

FIGS. 9A and 9B are partial cross-sectional views depicting two different approaches to enable the emissions substrate of FIGS. 8A and 8B as a backlight. A color modifier 902 overlies each emissive element bottom surface 304, and a liquid crystal display (LCD) substrate 900 overlies the modifier. Many different types of LCD substrates are well known in the art and details of their construction are omitted in the interest of brevity. In short, the LCD substrate 900 forms selectively engageable "windows" over each emissive element 300, and the color modifier 902 changes the color of light emitted by the emissive element to one appropriate to employ as an LCD display backlight. For example, if the emissive elements are GaN LEDs emitting a blue color light, the color modifier 902 may act to convert the blue light to a white color. For example, the color modifier 902 may be a stack comprising a red color modifier and a green color modifier, as explained in greater detail below. In FIG. 9A the color modifier is formed directly over the emissive elements 300, for example, by a printing process. In FIG. 9B the color modifiers 902 are a layer in the LCD substrate 900.

Figure 10A:
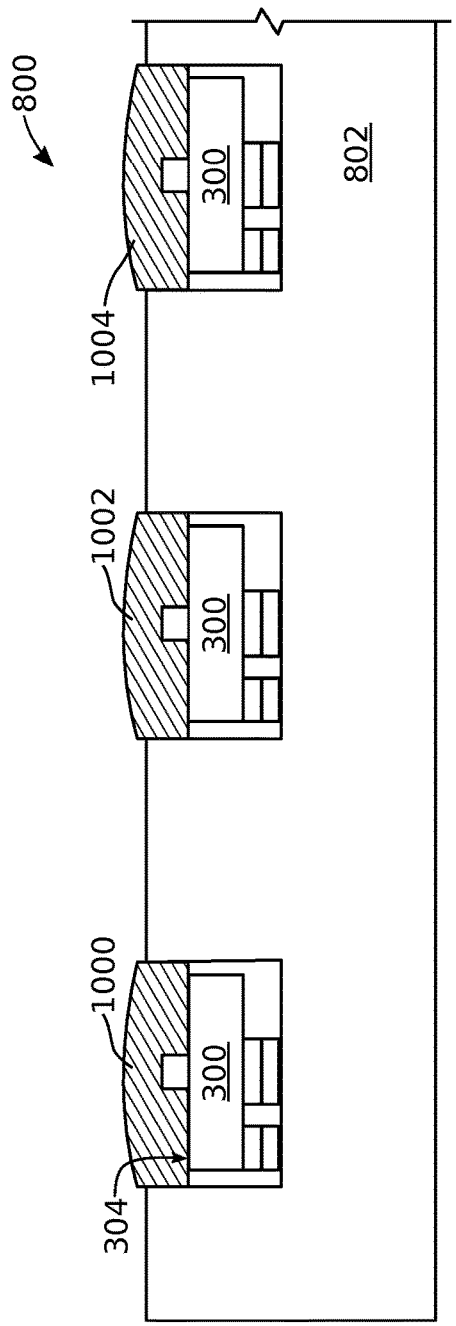
FIGS. 10A and 10B are partial cross-sectional views depicting different approaches enabling the emissions substrate as a direct emission display.
Figure 10B:
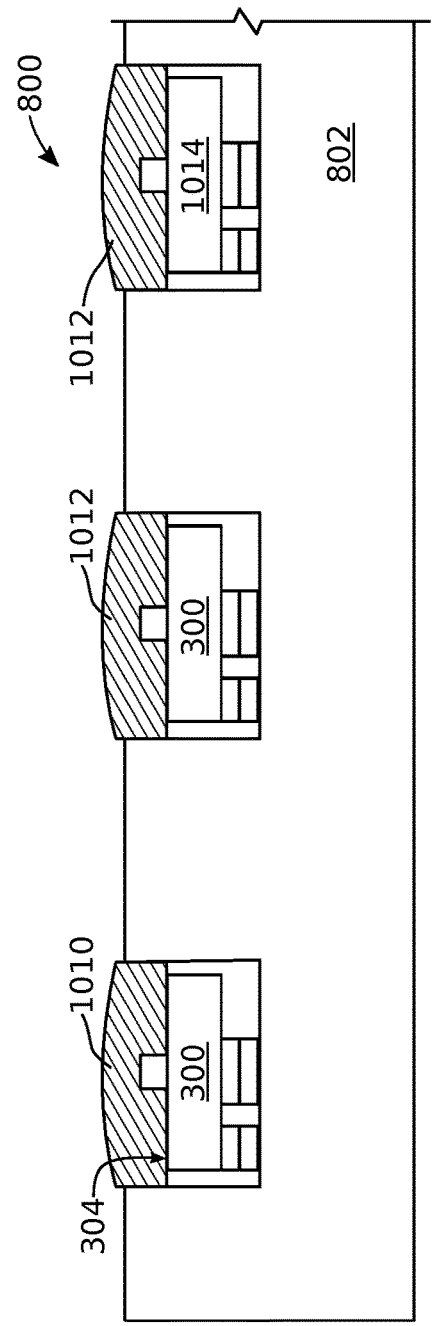

FIGS. 10A and 10B are partial cross-sectional views depicting different approaches enabling the emissions substrate as a direct emission display. In FIG. 10A a second plurality of first color modifiers 1000 overlie the bottom surfaces 304 of a corresponding second plurality of SMLEDs 300, where the second plurality is less than the first plurality. A second plurality of second color modifiers 1002 overlie the bottom surfaces 304 of a corresponding second plurality of SMLEDs 300, where the second color is different than the first color. Further, a second plurality of light diffusers 1004 overlies the bottom surfaces 304 of a corresponding second plurality of SMLEDs 300 with no overlying color modifier. Thus, if only GaN LEDs are used, the result is a second plurality of pixel regions (only one pixel region is shown), where each pixel region comprises a SMLED 300 with an overlying first color modifier 1000 (e.g., green), a SMLED with an overlying second color modifier 1002 (e.g., red), and a SMLED with no overlying color modifier (e.g., blue). Although a red-green-blue (RGB) display is described, it should be understood that additional colors could be added to each pixel region using additional color modifiers.

In FIG. 10B, a second plurality of green color modifiers 1010 overlie the bottom surfaces 304 of a corresponding second plurality of SMLEDs 300, where the second plurality is less than the first plurality. A third plurality of light diffusers 1012 overlies the bottom surfaces 304 of a corresponding third plurality of SMLEDs 300 with no overlying color modifier. The third plurality is less than the first plurality and equal to twice the second plurality in the case of an RGB display. The result is a second plurality of pixel regions, where each pixel region comprises a SMLED 300 (e.g., GaN LED) with an overlying red color modifier 1010, a blue color SMLED 300 (e.g., GaN LED) with no overlying color modifier 1012, and a green color SMLED 1014 (e.g., GaN LED) with no color modifier 1012. In one aspect, layers 1012 are light diffusers. In another aspect, color combinations may be enabled using both GaN and red emitting AlGaInP SMLEDs.

Figure 11A:
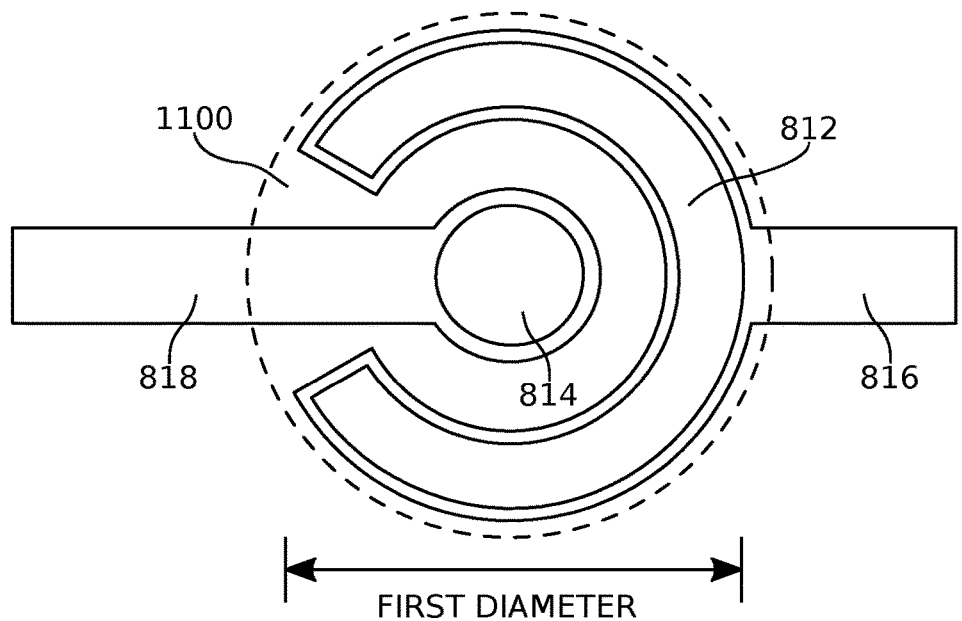
FIGS. 11A and 11B are, respectively, a plan view of a well bottom surface and a partial cross-sectional view of the emissions substrate.
Figure 11B:
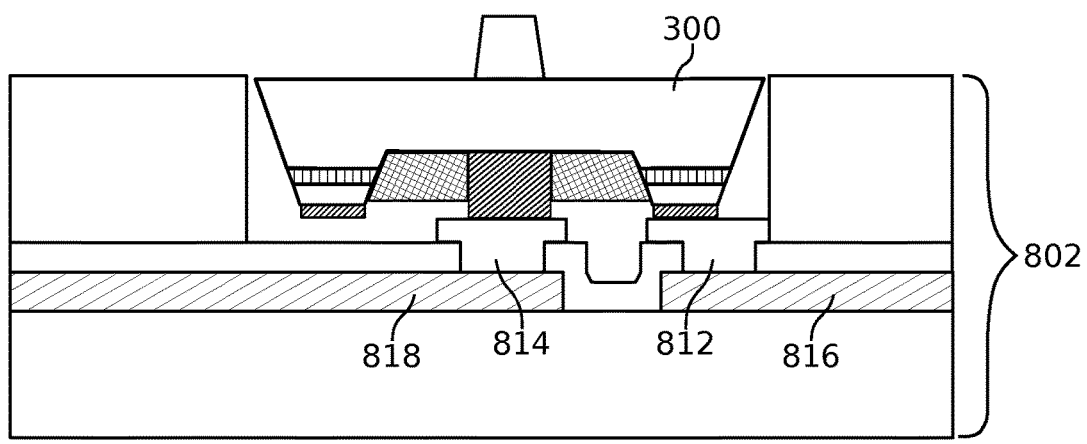

FIGS. 11A and 11B are, respectively, a plan view of a well bottom surface and a partial cross-sectional view of the emissions substrate. Referring briefly to FIG. 5, the first electrical contact 306 of each SMLED 300 may be configured as a ring with a first diameter. The first semiconductor layer 402 and MQW layer 406 of each SMLED 300 are a stack overlying the first electrical contact, in the shape of a ring. Note, first semiconductor layer 402 and MQW layer 406 are shown underling the first electrical contact 306 in FIG. 5, however when seated in the well, the first semiconductor layer 402 and MQW layer 406 overlie the first electrical contact. The second electrical contact 308 of each SMLED 300 is formed within a first electrical contact 306 ring perimeter. The second semiconductor layer 404 of each SMLED 300 has a disk shape with a center portion overlying (as explained above) the second electrical contact 308.

Returning to FIGS. 11A and 11B, each well first electrical interface 812 is configured as a partial ring with the first diameter, having a mouth 1100 opening, and is connected to trace 816. Each well second electrical interface 814 is connected to trace 818 extending into the mouth 1100 of a corresponding first electrical interface 812 partial ring.

Figure 12A:
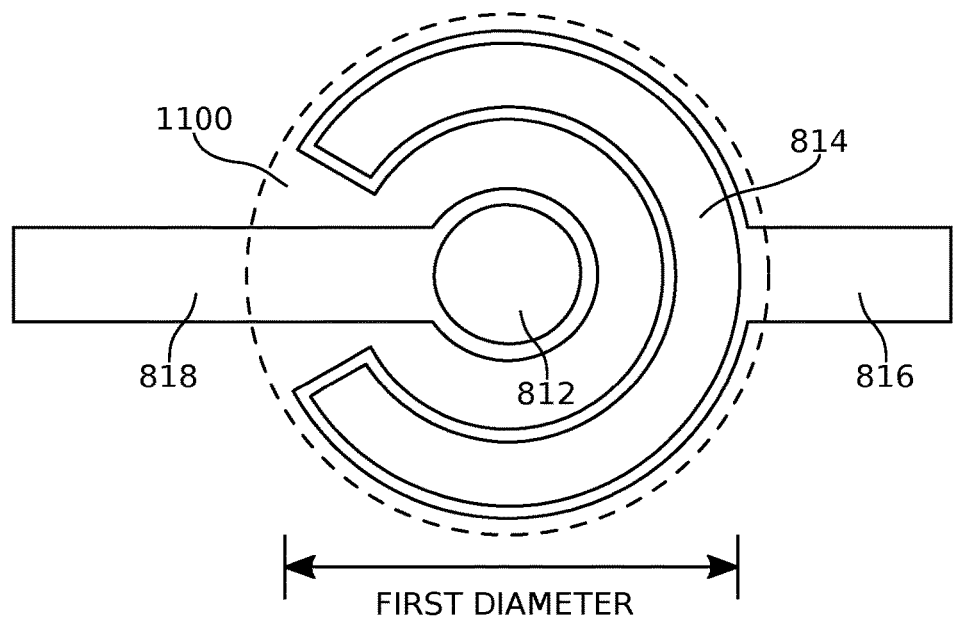
FIGS. 12A and 12B are, respectively, a variation of the well bottom surface plan view and emissions substrate partial cross-sectional view of FIGS. 11A and 11B.
Figure 12B:
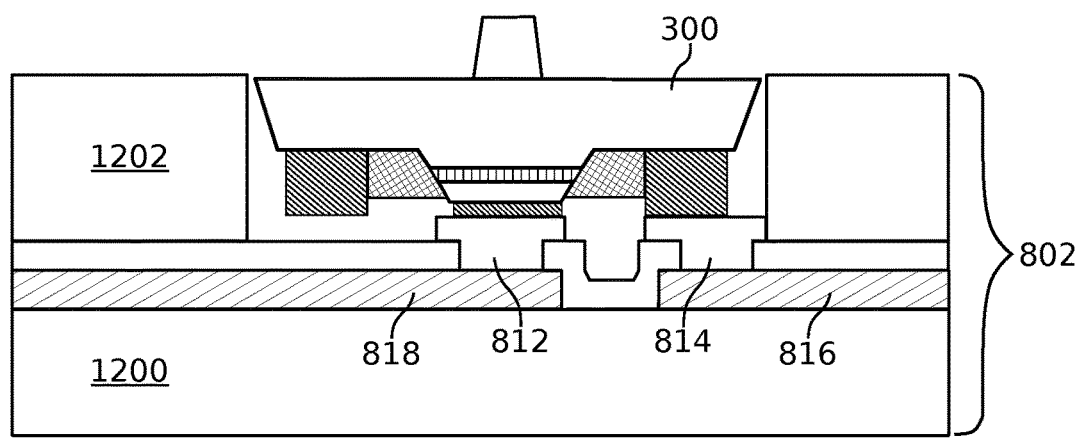

FIGS. 12A and 12B are, respectively, a variation of the well bottom surface plan view and emissions substrate partial cross-sectional view of FIGS. 11A and 11B. Referring briefly to FIGS. 4A and 4B, the second electrical contact 308 of each SMLED 300 may be configured as a ring with a first diameter. The second semiconductor layer 404 of each SMLED has a disk shape with a perimeter overlying the second electrical contact ring. The first electrical contact 306 of each SMLED is formed within a second electrical contact 308 ring perimeter. The first semiconductor layer 402 and MQW layer 406 of each SMLED are a stack overlying the first electrical contact 306. Note, first semiconductor layer 402 and MQW layer 406 are shown underling the first electrical contact 306 in FIG. 4A, however when seated in the well, the first semiconductor layer 402 and MQW layer 406 overlie the first electrical contact.

Returning to FIGS. 12A and 12B, each well second electrical interface 814 is configured as a partial ring or circular electrode with the first diameter, having a mouth opening 1100 and connected to trace 816. Each well first electrical interface 812 is connected to a trace 818 extending into the mouth 1100 of a corresponding second electrical interface 814 partial ring.

One other feature of note with respect to FIGS. 11B and 12B is that the emissions substrate 802 may be comprised of multiple levels. In FIG. 12B for example, the emissions substrate 802 may comprise a glass or plastic layer 1200, with conductive traces overlying layer 1200 connected to the well electrical interfaces. A transparent material layer 1202 may overlie the conductive traces and layer 1200, into which the wells are formed. For example, transparent material layer 1202 may be a dielectric material or a polyethylene naphthalate (PEN) film.

Figure 13A:
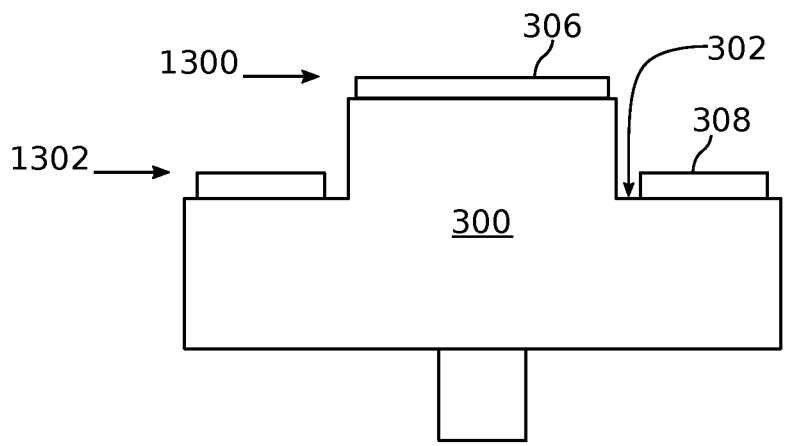
FIGS. 13A, 13B, and 13C are, respectively, a partial cross-sectional view of an emissive element variation, a well variation, and the emissive element seated in the well.
Figure 13B:
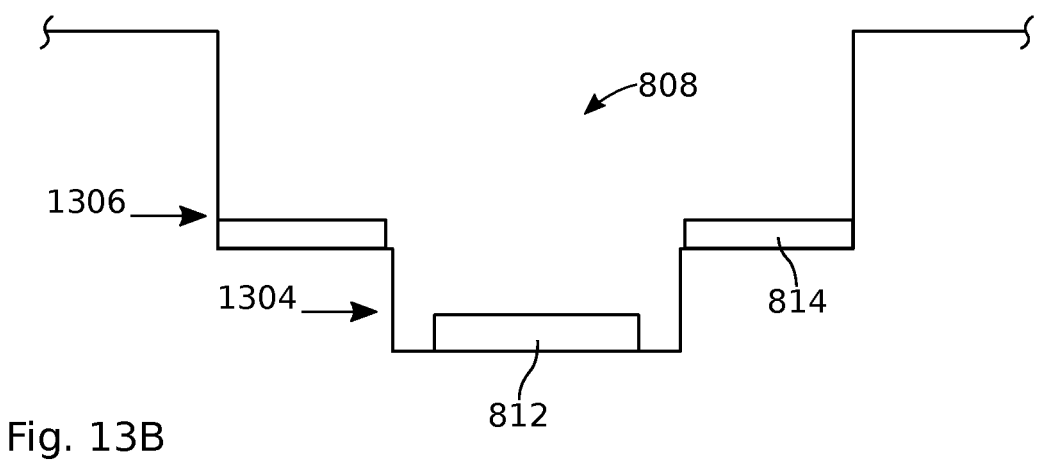
Figure 13C:
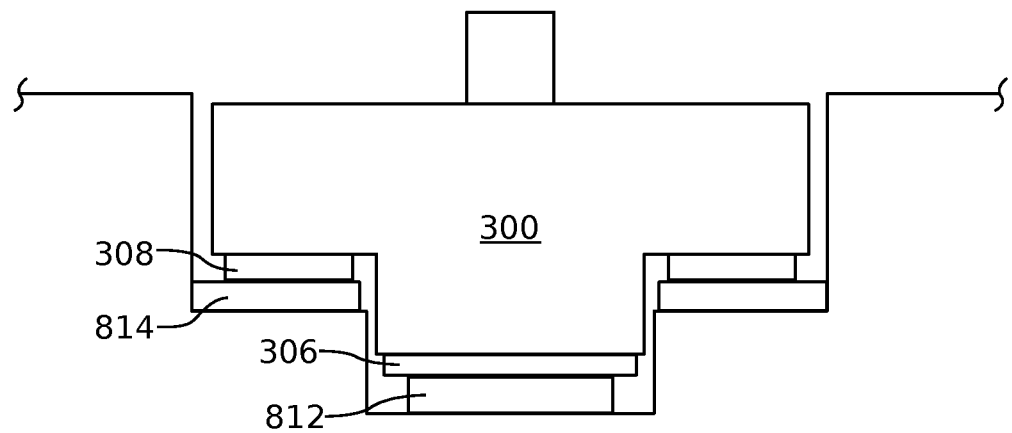

FIGS. 13A, 13B, and 13C are, respectively, a partial cross-sectional view an emissive element variation, a well variation, and the emissive element seated in the well. In one aspect, each emissive element top surface 302 is bi-planar with a first level 1300 and a second level 1302. The first electrical contact 306 is formed on the first level 1300 of the top surface 302, and the second electrical contact is formed 308 on the second level of the top surface. Alternatively but not shown, the first electrical contact 306 is formed on the second level of the top surface, and the second electrical contact is formed on the first level of the top surface. Likewise, each well bottom surface 808 is bi-planar with a first level 1304 and a second level 1306. Thus, each well first electrical interface is formed 812 on the well bottom first level 1304, and each well second electrical interface 814 is formed on the well bottom second level 1306.

Figure 14A:
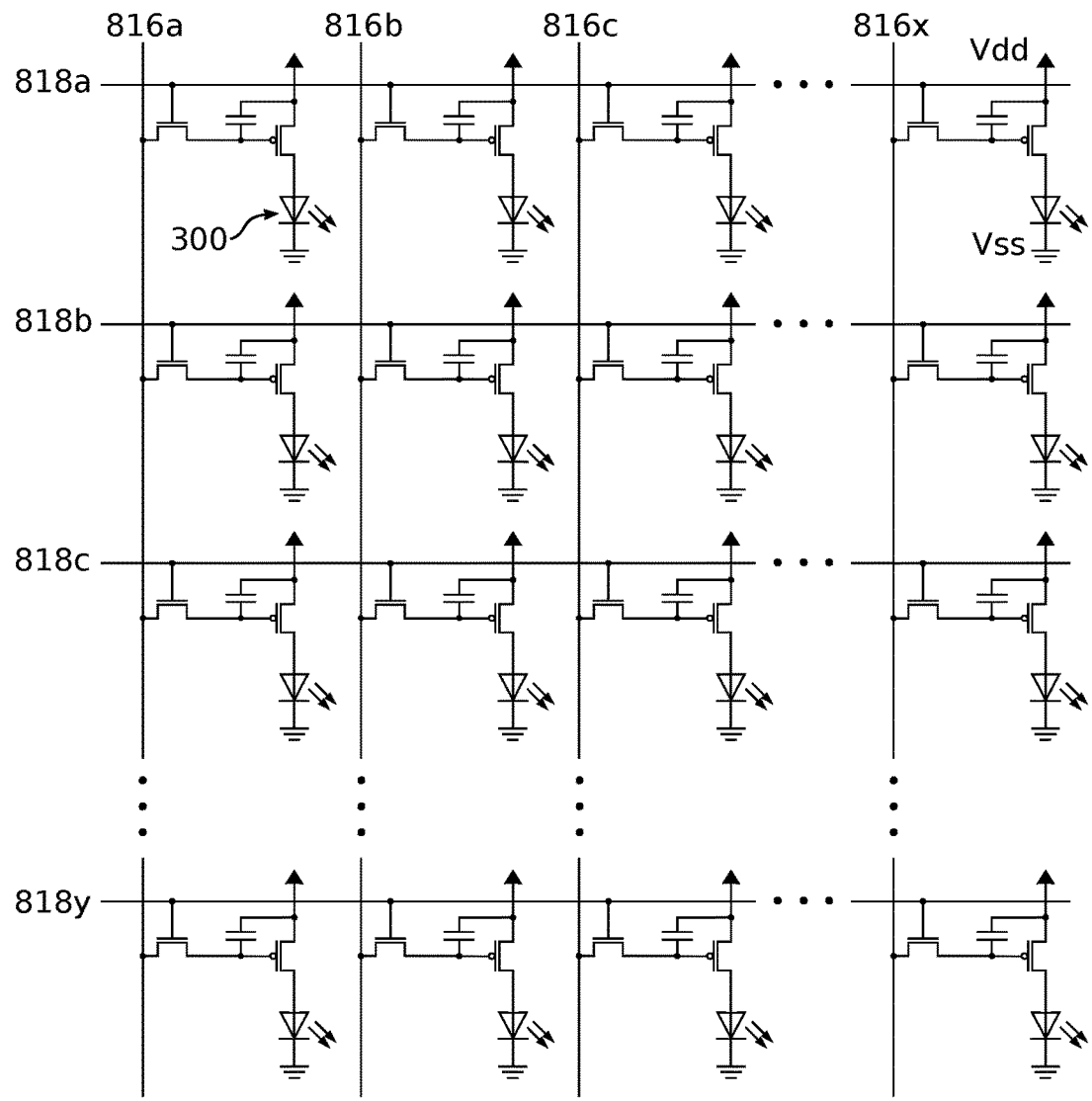
FIGS. 14A and 14B are, respectively, schematic and partial cross-sectional views of an emissions substrate enabled with a first plurality of active matrix (AM) drive circuits. One particular variation of a drive circuit is shown in FIG. 14C.
Figure 14B:
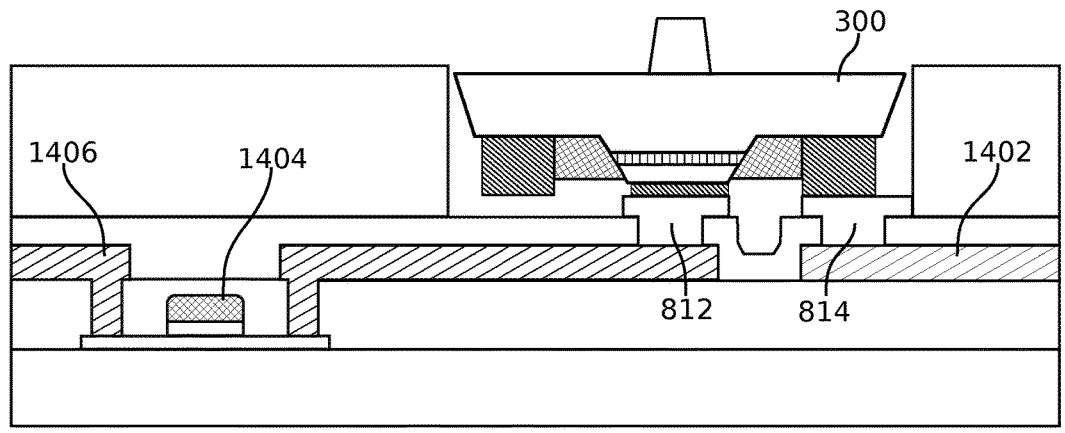
Figure 14C:
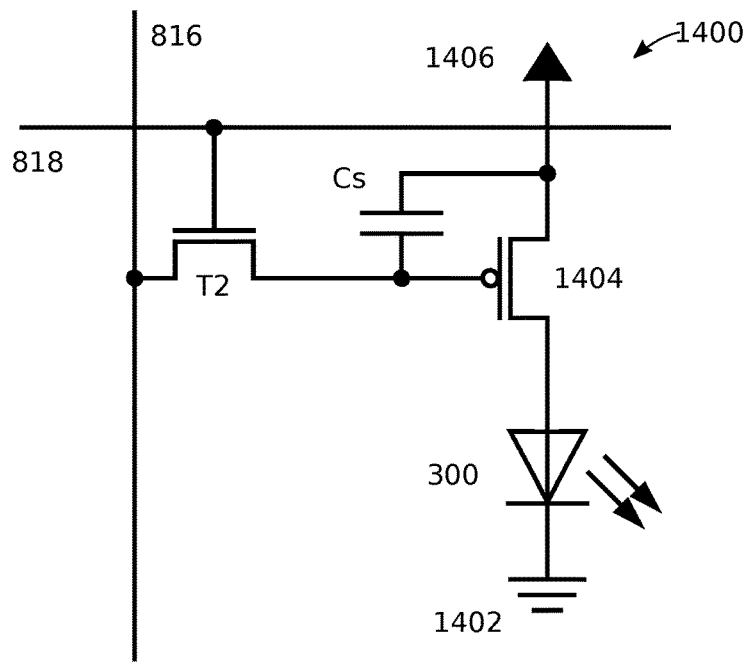

FIGS. 14A and 14B are, respectively, schematic and partial cross-sectional views of an emissions substrate enabled with a first plurality of active matrix (AM) drive circuits. One particular variation of a drive circuit is shown in FIG. 14C. Each drive circuit 1400 is connected to a corresponding column/row intersection, with an output connected to the first electrical interface 812 of a corresponding well. Alternatively, each drive circuit output may be connected to the second electrical interface of each well. A network of reference voltage (e.g., ground) traces 1402 are connected to the second electrical interface 814 of each well. FIG. 14B depicts just the final output transistor 1404 of a drive circuit that controls the output of a corresponding LED 300 by changing the interposing variable resistance between the dc power trace (Vdd) 1406 and the LED.

Figure 15A:
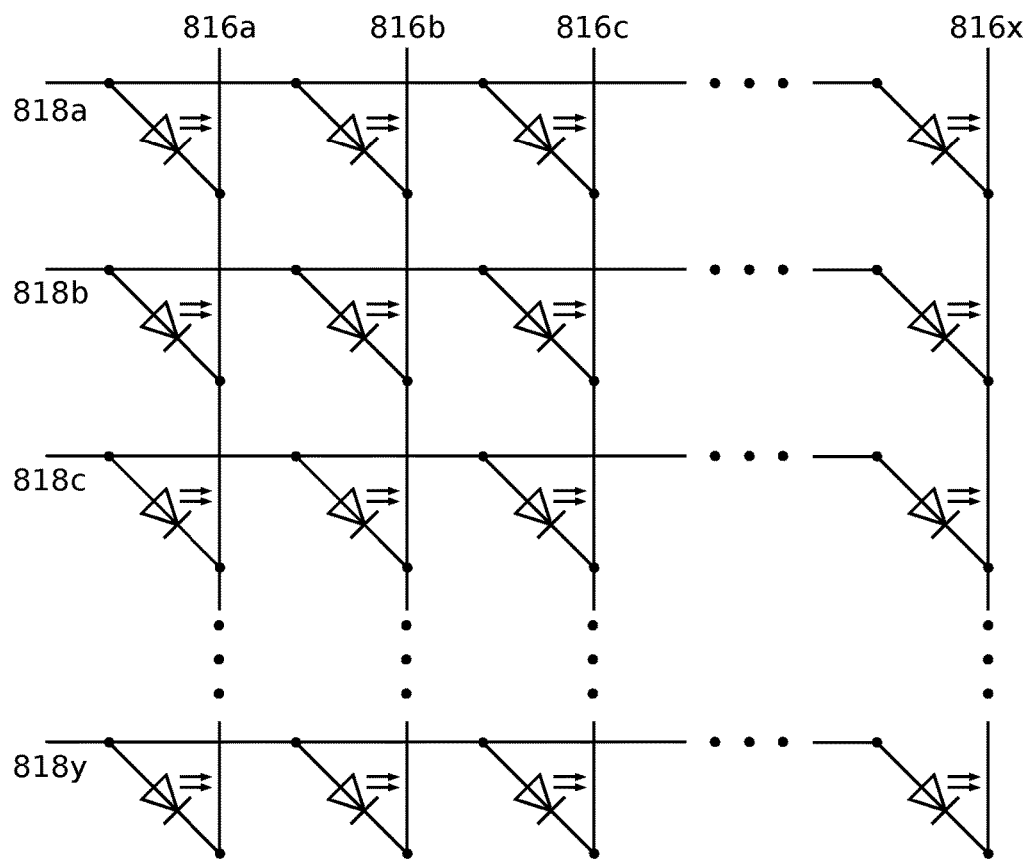
FIGS. 15A and 15B are, respectively, a schematic and a partial cross-sectional view of an emissions substrate where the emissive elements are enabled using a passive matrix.
Figure 15B:
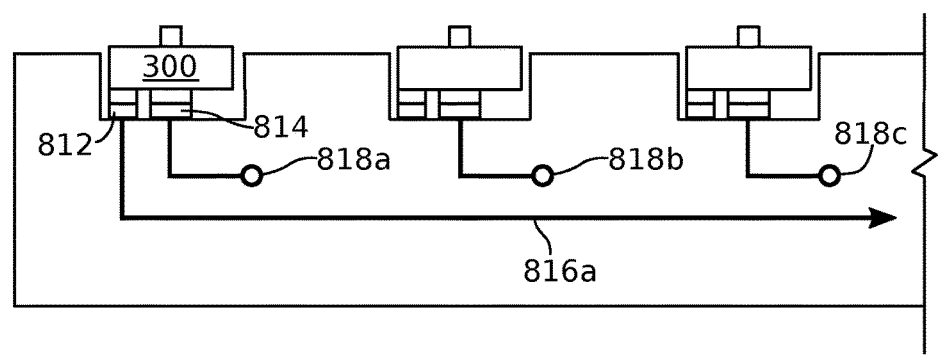

FIGS. 15A and 15B are, respectively, a schematic and a partial cross-sectional view of an emissions substrate where the emissive elements are enabled using a passive matrix. In this aspect, a series of column traces 816 and row traces 818 form a passive matrix (PM) with the column trace of each column/row intersection 820 is connected to the first electrical interface 812 of a corresponding well, and the row trace of each column/row intersection is connected to the second electrical interface 814 of each well.

uLED emitter elements can be manufactured using processes similar to those used for uLED lighting. However the size, shape, and configuration of the disks have additional requirements that do not exist for general lighting, as described below. Otherwise, the LEDs may be fabricated on a suitable backplane that can hold a large area array of uLEDs, with electrical connections made to them. Again, there are specific requirements for the size, shape, and position of features so that the uLEDs can be successfully positioned and connected. Finally, a fluidic assembly process can be used to position the uLEDs in an array and establish electrical connections to between each uLED and the backplane.

The emitter size point is an important distinction for displays. For general lighting and LCD backlights the emitter (emissive element) size tends to be whatever is convenient, and the important consideration is cost per photon. The most common (cheapest) LED for general lighting has an area of about 200×200 um, an LED thickness of about 5 um, a sapphire thickness of about 100 um. So the aspect ratio of the emissive element is about 2:1. In direct emissions applications the uLED emission area is chosen to produce sufficient illumination for one sub-pixel, which may be less than 25 um in diameter. Because of the uLED size, the fraction of the device area needed to make contact is important as larger contacts result in less emitter area, but smaller contacts increase loss due to the spreading resistance in the GaN layers.

uLED Fabrication

Surface mount uLEDs that might be used to make the emissive display disclosed herein may be fabricated from conventional high brightness LED wafers like those used to make emitters for general lighting as is well known in the art. The resulting uLEDs are from 10 to 100 microns (μm) in diameter and typically are in the form of round disks as shown in several of the above figures. The round disk shape is typical but other planar shapes such as triangles, squares, or hexagons could also be made in the same way and the display substrate would be fabricated with a well structure matching the uLED shape for fluidic assembly.

Briefly the process flow for manufacturing one particular type of uLED proceeds as follows:
1) Manufacture a planar high brightness blue LED wafer in the conventional manner as follows:
    a. On a sapphire substrate deposit a buffer layer and n-GaN (404) to form the LED cathode, see FIGS. 4A and 4B. The N doped GaN can be intrinsic (i.e. defect doped) or doped by the inclusion of trace amounts of silicon (Si).
    b. Deposit alternating layers of InGaN and GaN (406) to form a multiple quantum well structure (MQW).
    c. Deposit a hole blocking layer of AlGaN and a thin p-GaN layer (402) to form the LED anode. The p-GaN is typically magnesium (Mg) doped.
    d. Deposit an ITO current spreading layer on the p-GaN.
2) Form the LED emission area by etching the ITO, p-GaN, and MQW layers to make a mesa with some overetch into the n-GaN layer.
3) Form the uLED disk shape that is larger than the mesa formed in 2) by etching the n-GaN to the sapphire substrate. This is typically a close packed array of round disk shapes to maximize utilization of the device area. Other simple plate shapes such as triangles, squares, or hexagons can be used as long as the aspect ratio is suitable for fluidic assembly.
4) Deposit an insulating material (408) in a ring shape to electrically isolate the anode and cathode regions. This material can also contain a light absorbing material to prevent light leakage between the anode and cathode electrodes.
5) Deposit the anode electrode stack (308) to a suitable height. The electrode stack has several components in successive layers:
    a. A material such as titanium (Ti) having a work function matching that of n-GaN.
    b. A thick electrode that bonds to the display substrate well electrode, such as a layered structure of indium (In) and tin (Sn) with a thin gold cap to prevent oxidation.
6) Deposit the cathode electrode stack to a suitable height. The electrode stack has several components in successive layers:
    a. A material such as nickel/gold (Ni/Au), chromium/gold (Cr/Au), or Ti that makes good contact to the ITO current spreading layer.
    b. An electrode that bonds to the display substrate well electrode such as a layered structure of In and Sn with a thin gold cap to prevent oxidation.
7) Attach the top surface of the wafer to a glass handling substrate with an adhesive coating.
8) Laser liftoff (LLO) is used to remove the sapphire substrate and allow access to the bottom surface of the uLED structure.
9) The handle substrate with the uLEDs positioned in an array with the n-GaN side up is processed to make the orientation post (310). The post may be a photo patternable material such as SU-8 (a commonly used epoxy-based negative photoresist) or a deposited oxide or metal.

The completed uLEDs are harvested by dissolving the adhesive and collecting the disks in a fluid suspension, which may be an alcohol, polyol, ketone, halocarbon, or distilled (DI) water.

Figure 16:
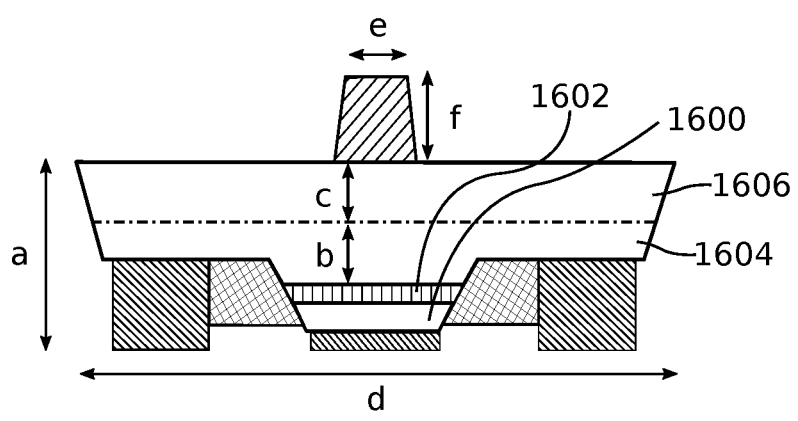
FIG. 16 is a partial cross-sectional view of a surface mount uLED designed for fluidic assembly.

FIG. 16 is a partial cross-sectional view of a vertical uLED designed for fluidic assembly. There are a number of constraints on the LED structure to improve the device performance as well as the fluidic assembly yield. In one aspect, commercially available GaN LED structures can be etched to make surface mount uLEDs (SM uLEDs), as shown. As used herein a SMuLED is defined as a device having two electrical contacts (adjacent the well bottom surface). In more detail, the SMuLED of FIG. 16 comprises p+-GaN 1600, MQW 1606, n+-GaN 1604, and n-GaN 1606. The c dimension may be 2 to 4 microns, and the b dimension may be 1 to 2 microns. Most of the characteristics required for fluidic assembly of vertical LEDs are also important for the surface mount uLED configuration. The following guidelines may be used for the production of vertical or surface mount uLEDs for surface fluidic assembly:

Substrate: is preferably sapphire for laser lift off. The surface may be planar or textured to improve light extraction.

n-GaN thickness (1604 and 1606): The main body of the SMuLED consists of intrinsic n-type GaN (1606) and Si-doped n-type GaN (1604). The thickness of each layer may be 3 µm or less, for each layer.

Disc diameter (d): The uLED thickness "a" determines the disk diameter. Usually, the d/a ratio is in the range of 5-50 um. If the disc thickness is ~5 µm, the disc diameter "d" may be between 30 and 120 µm. If disc thickness is 2 µm, the diameter "d" can be reduced to 5 µm-50 µm.

Post diameter (e): The ratio of e/d is between 10%-20%. For a 50 µm diameter disc, the post diameter may be 5-10 µm. For a 5 µm disc, the post diameter may be 0.5-1 µm.

Post height (f): The post height is about 30% to 100% of post diameter. For a 50 µm diameter disk, a 1 µm post height can be used, but a height of 2 µm is more effective at flipping surface-misoriented disks during fluidic assembly.

Stack height (a): The height of the stack "a", which is the summation of ("b"+"c"+the height of the MQW 1602+the height of the p+-GaN 1600) is in the range of 2 to 7 microns.

Emissions Substrate Fabrication and Requirements

Figure 17B:
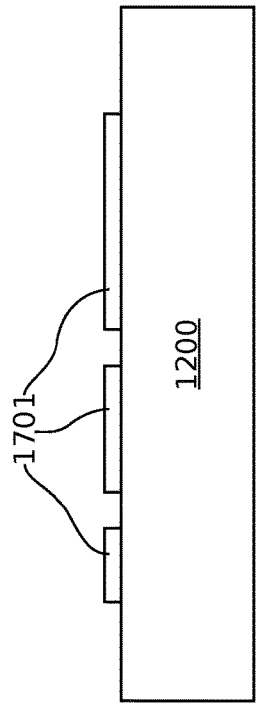
Figure 17D:
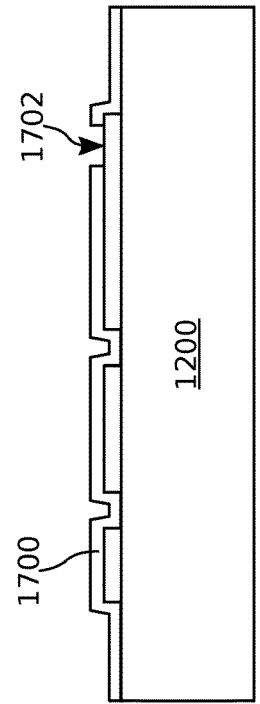
Figure 17A:
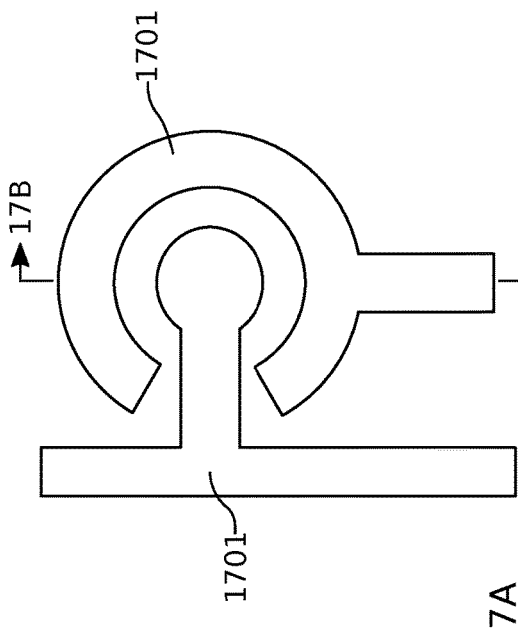
Figure 17C:
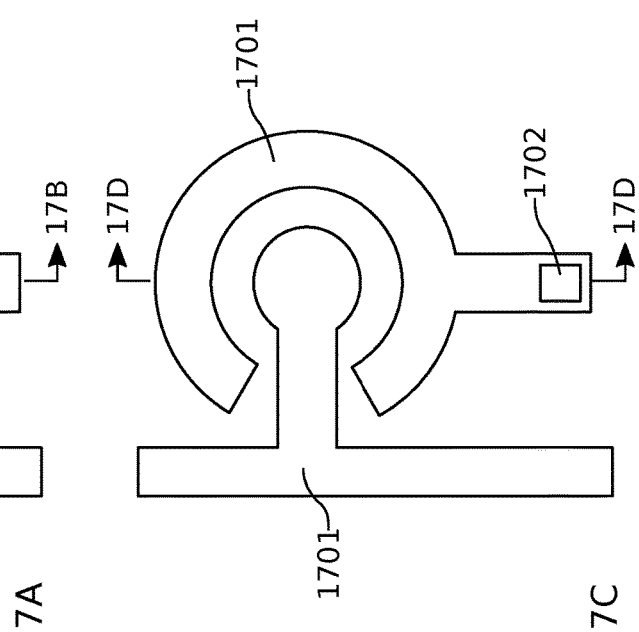
Figure 17J:
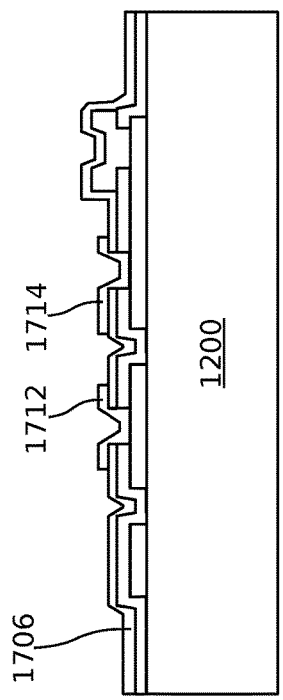

FIGS. 17A through 17L depict plan and partial cross-sectional views of an exemplary emissions substrate fabrication process. The uLED display emissions substrate (backplane) can be fabricated on large area glass or plastic substrates using conventional processes on the same equipment set that is used to fabricate LCD displays. A brief exemplary process flow to produce a simple passive matrix array connecting uLEDs in rows and columns proceeds as follows:

1) On a glass or plastic substrate 1200 deposit a first layer of metal interconnect, which may be tungsten or Ti/Al/Ti or some other low resistance metal. Pattern the first metal 1701 to form interconnects that will connect the electrical interface in the well bottom surface to a row and column. One basic electrode shape is the "C" or partial ring shape with a centered circle, as shown in FIGS. 17A and 17B.
2) Deposit an insulating layer 1700 (silicon dioxide (SiO$_2$), silicon nitride (Si$_3$N$_4$), or an insulating organic film) over the first metal 1701 and etch contact openings 1702 to connect with a subsequently deposited second metal, see FIGS. 17C and 17D.
3) Deposit a second layer of metal interconnect 1704, which may be tungsten or Ti/Al/Ti or some other low resistance metal. Pattern the metal 1704. Deposit an insulating layer 1706 (SiO$_2$, Si$_3$N$_4$, or an insulating organic film) over the second metal 1704, see FIGS. 17E and 17F.
4) Etch contact openings 1708 and 1710 to connect a subsequently deposited third metal layer, see FIGS. 17G and 17H.
5) Deposit a third local interconnect metal, forming 1712 and 1714 after patterning, which may be Ti, molybdenum (Mo), a gold/germanium stack (Au/Ge), or tungsten (w), and pattern the shape to match the size and spacing of the anode and cathode electrodes on the uLED. Interconnects 1712 and 1714 are shown as electrical interfaces in FIG. 8B. At this point the electrode layers as described are co-planar so the electrode surface of the uLED will rest evenly on the third metal surfaces 1712 and 1714, see FIGS. 17I and 17J.
6) Deposit an insulating material 1202 to form well structures to capture uLEDs in the fluidic assembly process. This may be spin-on glass (SOG), tetraethyl orthosilicate (TEOS) oxide, or polyimide and the patterning may be by photolithography or an etching process. By whatever means they are formed, the well sidewalls are preferably greater than 70 degrees, the depth of the well should be approximately the same as the thickness of the uLED, and the electrodes in the bottom of the well must be open to make contact with the uLED electrodes, see FIG. 17K.
7) After a fluidic assembly process, the uLED 300 is seated in the well, see FIG. 17L.

Fluidic Assembly of Surface Mount uLEDs

The suspension of surface mount uLEDs in a liquid is deposited on the prepared substrate and some means to induce flow is used to move the liquid across the substrate such that the uLEDs flow laterally across the surface of the substrate. Many possible techniques can be used to flow the liquid including pumping, gravity, brushing, ultrasonic transducers, an air knife, or nozzle, etc. One key point is that the disks are moved quickly enough across the surface to create many assembly opportunities without exerting so much force that disks are forced out of the wells.

The uLEDs have a higher density than the liquid so they settle to the substrate surface and can be captured by an open well. If the disk settles in the well with a post-down orientation, the edge of the disk bottom surface (with attached post) is above the surface of the substrate and the liquid flow exerts a torque that tends to flip the disk out of the well. If the disk settles in the well with a post-up orientation, only the post is subject to flow forces and the disk stays in the well with the proper surface orientation.

Carrying out this process with a sufficient number of disks over a long enough period of time increases the number of assembly attempts at each site until each well has a working uLED deposited in a post-up orientation. When assembly is complete the unused uLEDs are swept off the substrate into a sump or reservoir for recycling and the remaining liquid is allowed to evaporate or exchanged with a second liquid.

At this point it may be appropriate to use a visual inspection method to look for defects such as missing disks, wells that have been blocked by particles, or even disks in wells that are post down. It should be possible to repair a small number of defects using a pick and place technique to remove the defect if necessary. It is clear that more than one emitter per sub-pixel can be used to compensate for a single defect by redundancy, and a laser cutting strategy can be used to isolate a shorted uLED from the drive circuit.

Figure 17L:
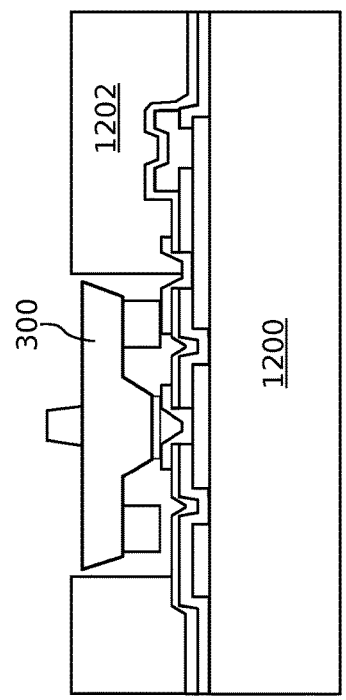
Figure 17I:
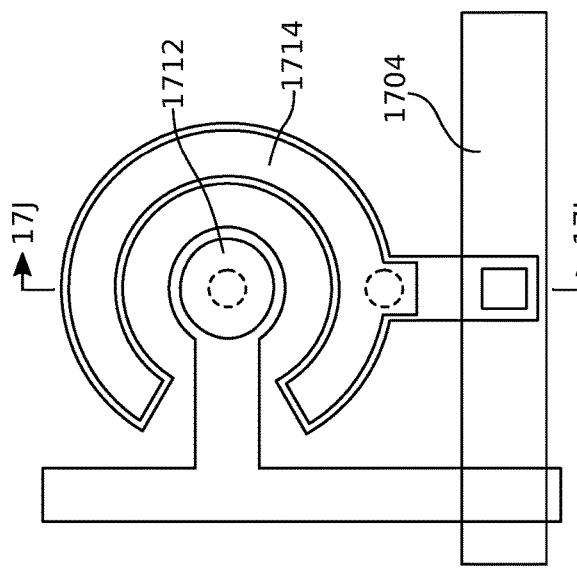
Figure 17K:
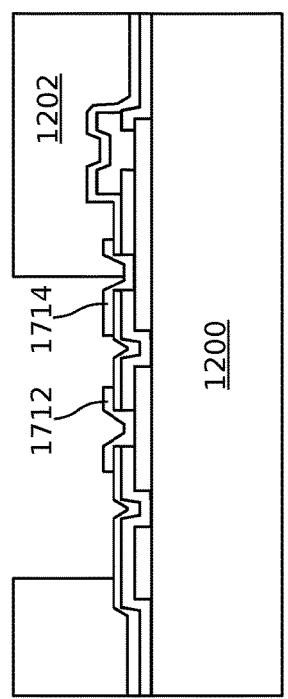

After assembly, all of the uLEDs are positioned with the anode and cathode electrodes over and in contact with the corresponding substrate electrodes, as shown in the FIG. 17L. The substrate is heated to a suitable temperature to cause the anode and cathode electrodes to interact with the substrate electrodes to form a stable mechanical and electrical connection. For In/Sn electrodes, a connection to Ti substrate electrodes can be made at an annealing temperature of 220° C. and the connection process is facilitated by the application of a liquid flux that breaks down surface oxide. LED electrodes made of other materials may be covered with a layer of In/Sn solder, or the substrate electrodes may be coated with In/Sn solder to aid in making electrical connections. AuGe eutectic solder electrodes, or electrodes coated with AuGe eutectic solder may also be used. However, AuGe has a higher annealing temperature of 380° C., which may not be appropriate for some fabrication processes. After annealing, the substrate can be rinsed to remove residual flux and a passivation coat such as polyimide or Si$_3$N$_4$ or the like may be deposited to prevent contact between the electrode interface and the environment.

Passive Matrix Array

The uLED pixel described above can be combined in an array to form a passive matrix array that has external driving circuits for each row and column, see FIG. 15A. Thus, the driving scheme works by setting an appropriate drive voltage at each column electrode, then turning on the appropriate row while all other rows are disconnected. The signal is applied for a short time (e.g., a few microseconds), the row electrode is disconnected, and the process is repeated for the next row. In this way each row is illuminated for the refresh time divided by the number of rows. If the refresh time is reasonably short, like 1/60 of a second, the human vision system averages everything out producing an image composed of all of the rows. However, it is clear that this approach is limited to a modest number of rows to maintain reasonable peak intensity and power.

Active Matrix Array

The passive matrix array described above is very simple but it has significant weaknesses for making a high resolution display. Because each row is addressed separately, there is a limited number of rows in the display that can be cycled for a realistic row duty cycle and power level. Further, the high emission required for the short time durations of LED enablement decreases the uLED lifetime.

Consequently, it is advantageous to use an active matrix display where a control element is fabricated on the display substrate, to control the emission for each sub pixel (LED) independently. With this architecture it is possible for each pixel to be illuminated continuously, although lower duty cycles may be advantageous in some situations. There are many possible circuits to accomplish this but the simplest consists of two transistors and a storage capacitor in addition to the uLED emissive element. As shown in FIG. 14C, transistor 1404 (T1) determines the amount of current flowing from Vdd through the uLED to Vss, based on the setting of the gate voltage established by the amount of charge stored on the storage capacitor (Cs). So in operation the pixel is programmed by setting an appropriate voltage on the column line and turning on the access gate T2, waiting for a few time constants for the voltage on Cs to stabilize, and then turning the access gate off to hold the charge on Cs. The circuit may use a low temperature poly silicon (LTPS) thin-film transistor (TFT) process to make a PMOS device for the drive transistor T1 because of the combination of high mobility and stability exhibited by these devices. It is possible that a similar pixel made with indium gallium zinc oxide (IGZO) TFTs can be used, but IGZO has only 10-20% as much mobility as an LTPS transistor of the same size. So for a given pixel size, the limitations of the IGZO TFT performance yield lower luminance per pixel, as compared with LTPS. As is well known in the art, there are a great number of drive circuits used in displays to selectively power emissive elements, many of which use more than two TFTs. The display described herein is not limited to any particular type of drive circuit or any particular number of transistors per drive circuit.

Color Generation Using Blue uLEDs

In one aspect, the emissive substrate is monochrome, typically blue, for use as an LCD backlight. However, the substrate can also be used for RGB color generation. There are two approaches to generating color (green and red) by down-conversion of a blue LED light.

Figure 18:
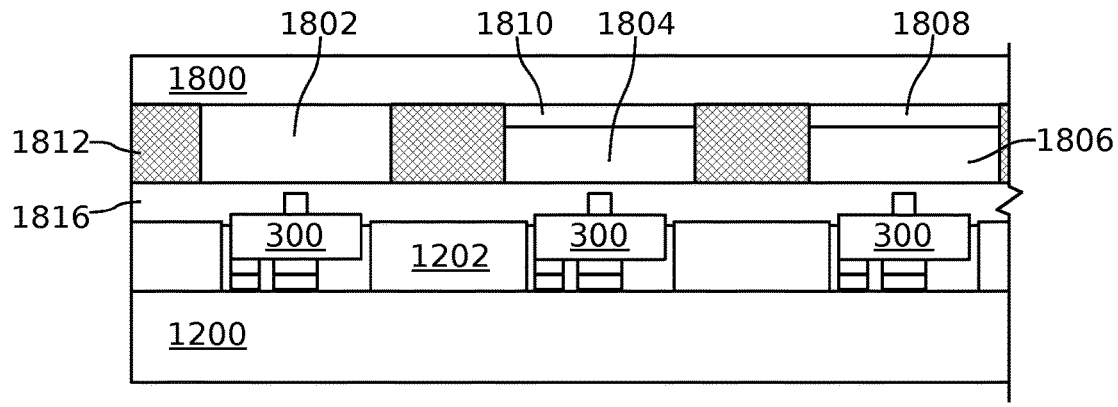
FIG. 18 is a partial cross-sectional view depicting color generation through the use of a separate color conversion sheet.

FIG. 18 is a partial cross-sectional view depicting color generation through the use of a separate color conversion sheet. The quantum dot color filter (QDCF) approach uses quantum dots (QD) in a matrix printed on a separate substrate, similar to the color filter process used in LCD display. The color conversion sheet 1800 has a diffuser 1802 over the blue sub-pixel 300 and quantum dot color converters 1804 and 1806 to respectively generate red and green light, and color filters 1808 and 1810 to block blue contamination. Each conversion element is surrounded by an absorber 1812 (black matrix) to prevent light scattering to adjacent pixels. The color conversion sheet 1800 is aligned and bonded to the emissions substrate (1200/1202) over the uLED emitters 300. Layer 1816 represents an adhesive used to bind the emissive substrate 1200 to the color conversion sheet 1800.

Figure 19:
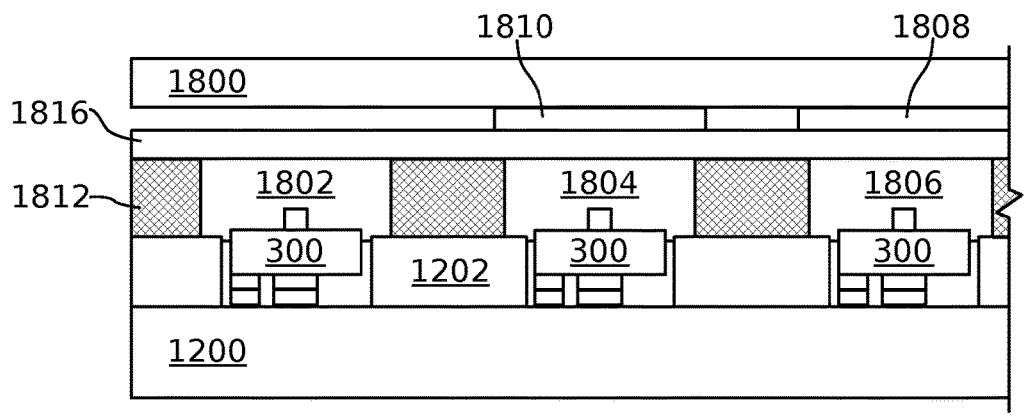
FIG. 19 is a partial cross-sectional view of color generation through the use of phosphors deposited over the emissive elements.

FIG. 19 is a partial cross-sectional view of color generation through the use of phosphors deposited over the emissive elements. The phosphor can be conventional ceramic phosphor with diameter in micron-meter range or QD with diameter in nanometer range. The quantum dot LED (QDLED) approach is similar to the QDCF approach with a diffuser 1802, red QD matrix 1804, and green QD matrix 1806 printed directly on the uLEDs 300 and surrounded by black matrix 1812. Then, any unwanted blue light contamination for red and green pixels is absorbed by red and green color filters 1808 and 1810 on the separate color filter sheet 1800 bonded to the emissions substrate. Conventional phosphors are mixed as received into phosphor binder. Commercially available red and green phosphor materials have particle sizes of around an 8 μm diameter. The particles are mixed with an appropriate binder material that is suitable for the printing process. A gravure printing technique, for example, entails inking a pattern plate, wiping excess ink from the pattern plate, and subsequent transfer of the phosphor ink pattern from the pattern plate to the emissions substrate. Other printing techniques could be applied for this process such as screen print, flexography, offset, extrusion, or inkjet. In one aspect, the phosphor ink is thermally cured on a hotplate at 140° C. for 8 minutes. Further processing is dictated by the specific materials used for phosphor and binder.

It is also possible to use this approach and two separate LED fluidic assembly flows, to make a hybrid display with blue and green uLEDs and red generated using a blue uLED and red QD color converter.

The QDCF approach has the advantage of placing the QD material away from the LEDs so there is a lower temperature and consequently less thermal impact on the performance and reliability of the QDs. Both approaches require high loading of QDs to achieve high efficiency of color conversion in a relatively thin film, and both approaches are challenging for ink jet printing resolution.

Color Generation Using all Inorganic uLEDs

Figure 20A:
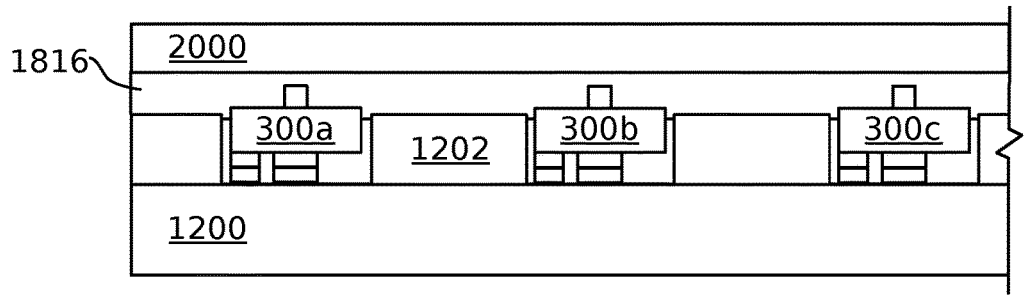
FIGS. 20A and 20B are, respectively, a partial cross-sectional view and light intensity graph for an emissive substrate using three different LED types, to respectively generate three different colors.
Figure 20B:
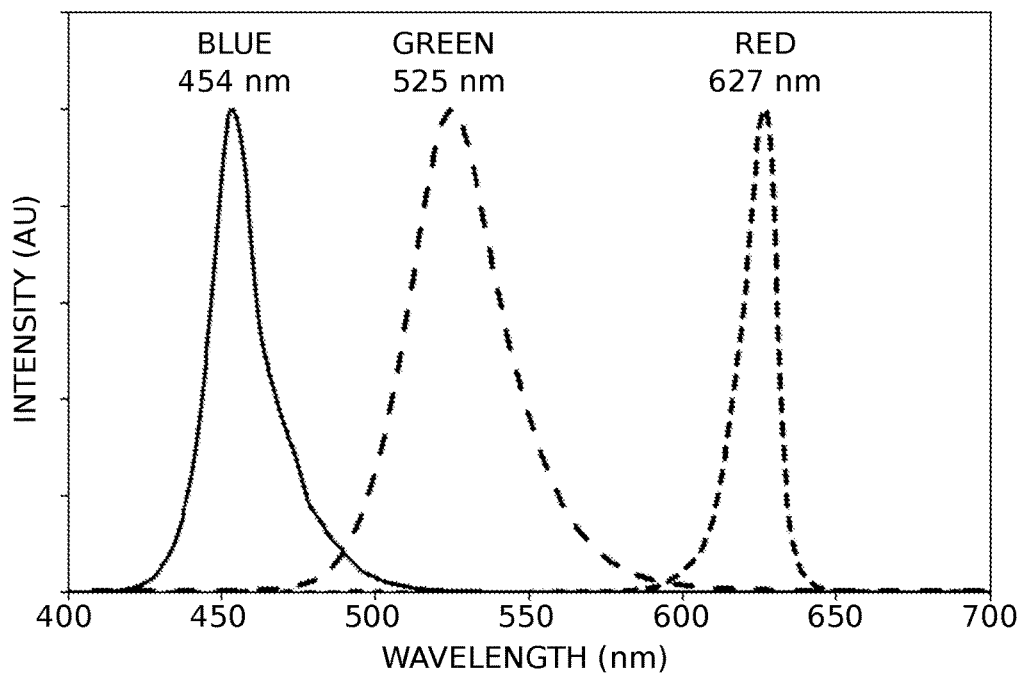

FIGS. 20A and 20B are, respectively, a partial cross-sectional view and light intensity graph for an emissive substrate using three different LED types, to respectively generate three different colors. FIG. 20A depicts a cover glass 2000 bound to substrate 1200 with adhesive layer 1816. In this approach color generation may be achieved using three inorganic LEDs 300a, 300b, and 300c, respectively emitting at 450 nm (blue), 530 nm (green), and 630 nm (red). This gives very narrow emission peaks for each color, which gives the best color gamut and image appearance, as shown in FIG. 20B. There are two major hurdles for this approach however. Red LEDs are not made using GaN, but rather, with AlGaInP diodes grown on a GaAs substrate. Consequently, the LED fabrication and harvest procedures recited for GaN (blue) LEDs are not appropriate for red uLEDs. Further, three-emitter displays require the development of fluidic assembly techniques that can align three different LED shapes or size. The red LEDs made from AlGaInP may have different operating voltages and temperature behavior than GaN LEDs, in addition to being more brittle than GaN based devices.

Color Conversion for LCD Back Light Unit (BLU)

Figure 21A:
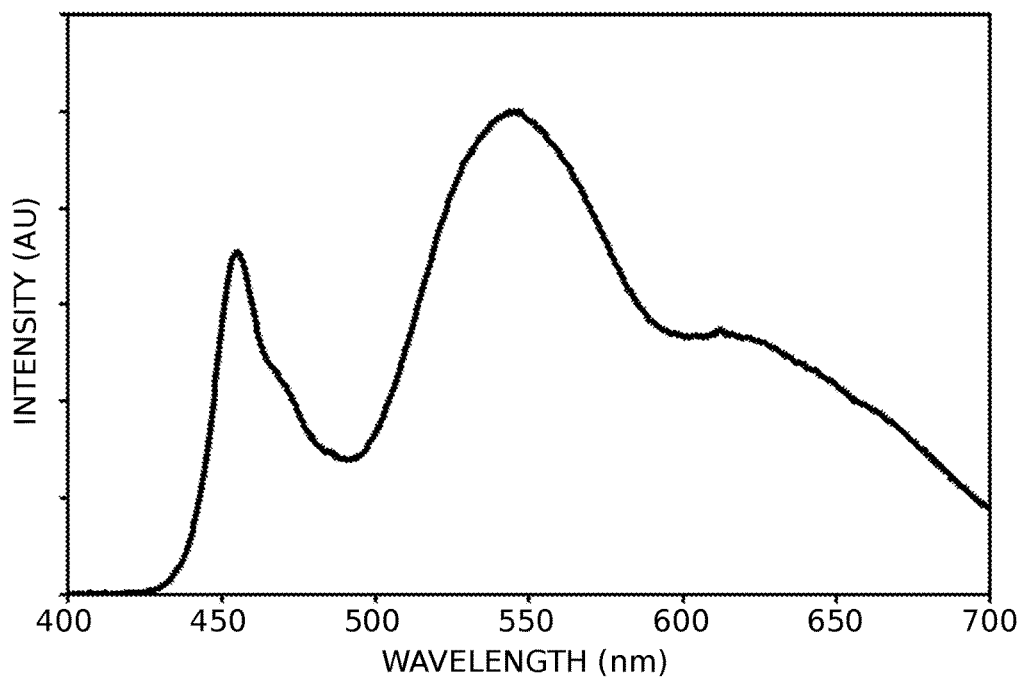
FIGS. 21A, 21B, and 21C respectively depict a white light phosphor intensity graph, exemplary stacked color filter, and associated stacked color filter intensity graph.
Figure 21B:
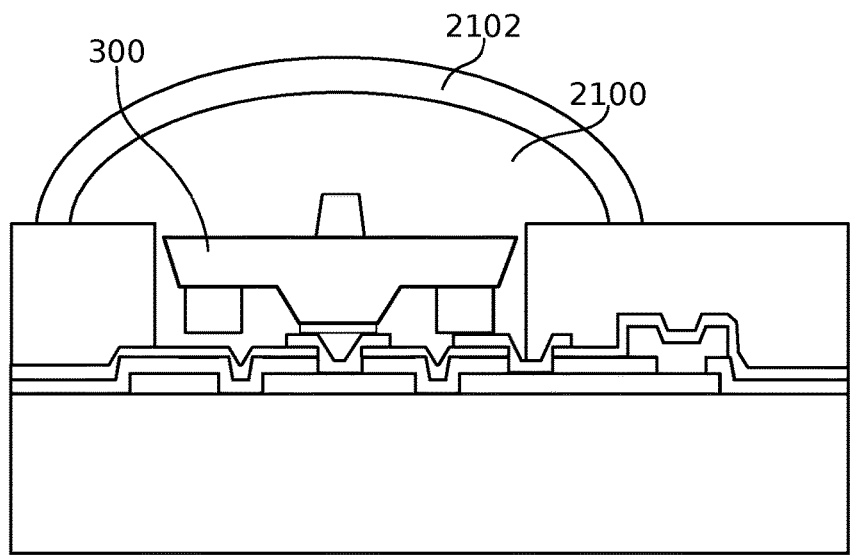
Figure 21C:
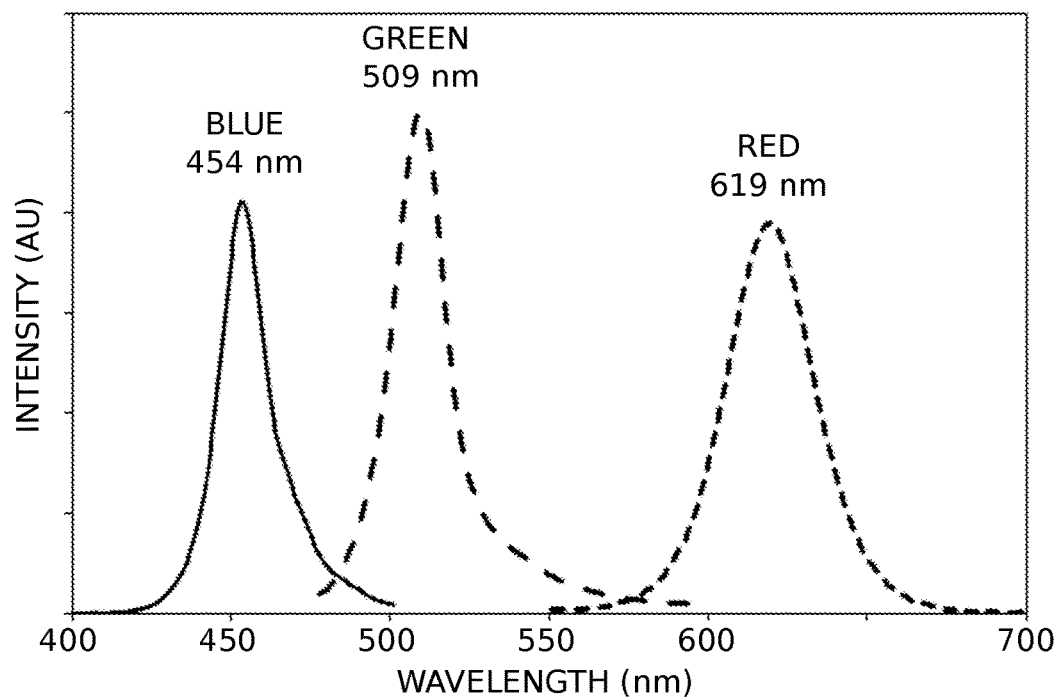

FIGS. 21A, 21B, and 21C respectively depict a white light phosphor intensity graph, exemplary stacked color modifier, and associated stacked color modifier intensity graph. The uLED emissive display can also be used as a local dimming backlight unit (BLU) by including a phosphor material to generate red and green colors by down-conversion of the blue light emitted by the uLEDs. So the BLU will be a low resolution copy of the display image to increase dynamic range by better matching the output of the backlight to the requirements of the image. One simple version of the BLU is a uniform coating of white light color conversion phosphor. A more sophisticated version might use a layer of a red color conversion phosphor 2100 printed over the LED 300, followed by a coating of green color conversion phosphor 2102, as shown in FIG. 21B. Using high quality quantum dot color converters with an optical density tuned to allow the right amount of blue to pass through, the spectrum of FIG. 21C is obtained. A printing process may be used to deposit QDs only over the uLED, and depositing the green layer over the red layer helps by limiting the absorption of green light in the red converter. However, a uniform coating over the whole substrate with mixed red and green converters is also effective, albeit at a higher cost.

A surface mount emissive device and display fabrication method using a surface mount emissive device are provided. Examples of particular material, dimensions, and circuit layouts have been presented to illustrate the invention. However, the invention is not limited to merely these examples. Other variations and embodiments of the invention will occur to those skilled in the art.

The invention claimed is:

1. A surface mount emissive element comprising:
   a top surface;
   a bottom surface;
   a first electrical contact formed exclusively on the top surface and configured as a ring;
   a first semiconductor layer and a multiple quantum well (MQW) layer stack underlying the first electrical contact, in the shape of a ring;
   a second electrical contact formed exclusively on the top surface within a first electrical contact ring perimeter;
   a second semiconductor layer having a disk shape with a center portion underlying the second electrical contact; and,
   a post in contact with, and extending from the bottom surface.

2. The surface mount emissive element of claim 1 wherein the surface mount element is a surface mount light emitting diode (SMLED) comprising:
   the first semiconductor layer, with a dopant selected from a first group consisting of an n-dopant or a p-dopant;
   the second semiconductor layer, with the unselected dopant from the first group; and,
   the layer interposed between the first semiconductor layer and the second semiconductor layer.

3. The surface mount emissive element of claim 2 wherein the first semiconductor layer and second semiconductor layer are a material selected from the group consisting of gallium nitride (GaN) and aluminum gallium indium phosphide (AIGaInP).

4. The surface mount emissive element of claim further comprising:
   a moat formed between the first electrical contact ring and the second electrical contact; and,
   an electrical insulator filling the moat.

5. The surface mount emissive element of claim 1 wherein the top surface is planar; and,
   wherein the bottom surface is planar.

6. The surface mount emissive element of claim 1 wherein the top surface is bi-planar with a first level and a second level;
   wherein the first electrical contact is formed on the first level of the top surface; and,
   wherein the second electrical contact is formed on the second level of the top surface.

7. The surface mount emissive element of claim 1 further comprising:
   a plurality of posts extending from the bottom surface.

8. The surface mount emissive element of claim 1 wherein the first and second electrical contacts are solder-coated.

9. The surface mount emissive element of claim 1 wherein the post is an electrically nonconductive material.

10. An emissive display comprising:
    an emissions substrate comprising:
      a top surface;
      a first plurality of wells formed in the emissions substrate top surface, each well comprising a bottom surface, sidewalls, a first electrical interface formed on the bottom surface, and a second electrical interface formed on the bottom surface;
      a matrix of column and row conductive traces forming a first plurality of column/row intersections, where each column/row intersection is associated with a corresponding well;
    a first plurality of surface mount emissive elements populating the wells, each emissive element comprising:
      a top surface overlying a corresponding well bottom surface;
      a bottom surface;
      a first electrical contact formed on the top surface and connected to a corresponding well first electrical interface;
      a second electrical contact formed on the top surface and connected to a corresponding well second electrical interface; and,
      a post extending from the bottom surface.

11. The emissive display of claim 10 further comprising:
    a color modifier overlying each emissive element bottom surface; and,
    a liquid crystal display (LCD) substrate overlying the color modifier.

12. The emissive display of claim 10 wherein the emissive elements are surface mount light emitting diodes (SMLEDs), each SMLED comprising:
    a first semiconductor layer, with a dopant selected from a first group consisting of an n-dopant or a p-dopant;
    a second semiconductor layer, with the unselected dopant from the first group; and,
    a multiple quantum well (MQW) layer interposed between the first semiconductor layer and the second semiconductor layer.

13. The emissive display of claim 12 wherein the first and second semiconductor layers are selected from the group consisting of gallium nitride (GaN) and aluminum gallium indium phosphide (AIGaInP).

14. The emissive display of claim 13 further comprising:
a second plurality of first color modifiers overlying the bottom surfaces of a corresponding second plurality of SMLEDs, where the second plurality is less than the first plurality;
a second plurality of second color modifiers overlying the bottom surfaces of a corresponding second plurality of SMLEDs, where the second color is different than the first color.

15. The emissive display of claim 14 further comprising:
a second plurality of light diffusers overlying the bottom surfaces of a corresponding second plurality of SMLEDs with no overlying color modifier.

16. The emissive display of claim 15 further comprising:
a second plurality of pixel regions, each pixel region comprising a SMLED with an overlying first color modifier, a SMLED with an overlying second color modifier, and a SMLED with no overlying color modifier; and,
wherein the first color is green, the second color is red, and wherein the SMLED with no overlying color modifier emits a blue light.

17. The emissive display of claim 13 further comprising:
a second plurality of red color modifiers overlying the bottom surfaces of a corresponding second plurality of SMLEDs, where the second plurality is less than the first plurality;
a third plurality of light diffusers overlying the bottom surfaces of a corresponding third plurality of SMLEDs with no overlying color modifier, where the third plurality is less than the first plurality and equal to twice the second plurality; and,
a second plurality of pixel regions, each pixel region comprising a SMLED with an overlying red color modifier, a blue color SMLED with no overlying color modifier, and a green color SMLED with no color modifier.

18. The emissive display of claim 12 wherein the first electrical contact of each SMLED is configured as a ring with a first diameter;
wherein the first semiconductor layer and MQW layer of each SMLED are a stack overlying the first electrical contact, in the shape of a ring;
wherein the second electrical contact of each SMLED is formed within a first electrical contact ring perimeter;
wherein the second semiconductor layer of each SMLED has a disk shape with a center portion overlying the second electrical contact;
wherein each well first electrical interface is configured as a partial ring with the first diameter, and having a mouth opening; and,
wherein each well second electrical interface is configured as a trace extending into the mouth of a corresponding first electrical interface partial ring.

19. The emissive display of claim 12 wherein the second electrical contact of each SMLED is configured as a ring with a first diameter;
wherein the second semiconductor layer of each SMLED has a disk shape with a perimeter overlying the second electrical contact ring;
wherein the first electrical contact of each SMLED is formed within a second electrical contact ring perimeter;
wherein the first semiconductor layer and MQW layer of each SMLED are a stack overlying the first electrical contact;
wherein each well second electrical interface is configured as a partial ring with the first diameter, and having a mouth opening; and,
wherein each well first electrical interface is configured as a trace extending into the mouth of a corresponding second electrical interface partial ring.

20. The emissive display of claim 10 wherein each emissive element top surface is planar; and,
wherein each well bottom surface is planar.

21. The emissive display of claim 10 wherein each emissive element top surface is bi-planar with a first level and a second level;
wherein each emissive element first electrical contact is formed on the first level of the top surface;
wherein each emissive element second electrical contact is formed on the second level of the top surface;
wherein each well bottom surface is bi-planar with a first level and a second level;
wherein each well first electrical interface is formed on the well bottom first level; and,
wherein each well second electrical interface is formed on the well bottom second level.

22. The emissive display of claim 10 further comprising:
a first plurality of active matrix (AM) drive circuits, each drive circuit connected to a corresponding column/row intersection, and connected to the first electrical interface of a corresponding well; and,
a network of reference voltage traces connected to the second electrical interface of each well.

23. The emissive display of claim 10 wherein the matrix of column and row traces form a passive matrix (PM) with the column trace of each column/row intersection connected to the first electrical interface of a corresponding well, and the row trace of each column/row intersection connected to the second electrical interface of each well.

24. The emissive display of claim 10 further comprising:
a solder coating applied to elements selected from the group consisting of the first and second electrical contacts of the emissive elements, the first and second electrical interfaces in the wells, or both the first and second electrical contacts of the emissive elements and the first and second electrical interfaces in the wells.

25. A surface mount emissive element comprising:
a top surface;
a bottom surface;
a first electrical contact formed exclusively on the top surface;
a first semiconductor layer and a multiple quantum well (MQW) layer stack underlying the first electrical contact;
a second electrical contact formed exclusively on the top surface, configured as a ring;
a second semiconductor layer having a disk shape with a perimeter underlying the second electrical contact ring;
a post in contact with, and extending from the bottom surface; and,
wherein the first electrical contact is formed within a second electrical contact ring perimeter.

26. The surface mount emissive element of claim 25 wherein the surface mount element is a surface mount light emitting diode (SMLED) comprising:
the first semiconductor layer, with a dopant selected from a first group consisting of an n-dopant or a p-dopant;
the second semiconductor layer, with the unselected dopant from the first group; and,
the MQW layer interposed between the first semiconductor layer and the second semiconductor layer.

27. The surface mount emissive element of claim 26 wherein the first semiconductor layer and second semiconductor layer are a material selected from the group consisting of gallium nitride (GaN) and aluminum gallium indium phosphide (AlGaInP).

28. The surface mount emissive element of claim 25 further comprising:
   a moat formed between the second electrical contact ring and the first electrical contact; and,
   an electrical insulator filling the moat.

29. The surface mount emissive element of claim 25 wherein the top surface is planar; and,
   wherein the bottom surface is planar.

30. The surface mount emissive element of claim 25 wherein the top surface is bi-planar with a first level and a second level;
   wherein the first electrical contact is formed on the first level of the top surface; and,
   wherein the second electrical contact is formed on the second level of the top surface.

31. The surface mount emissive element of claim 25 further comprising:
   a plurality of posts extending from the bottom surface.

32. The surface mount emissive element of claim 25 wherein the first and second electrical contacts are solder-coated.

* * * * *

UNITED STATES PATENT AND TRADEMARK OFFICE
CERTIFICATE OF CORRECTION

PATENT NO. : 9,825,202 B2  
APPLICATION NO. : 15/410001  
DATED : November 21, 2017  
INVENTOR(S) : Paul J. Schuele et al.

Page 1 of 1

It is certified that error appears in the above-identified patent and that said Letters Patent is hereby corrected as shown below:

In the Claims

In Column 17, Line 59 (Claim 2), the term "MQW" is missing between the word "the" (first instance) and the word "layer" (first instance).

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*